United States Patent
Witkoe et al.

(10) Patent No.: US 12,206,236 B2
(45) Date of Patent: Jan. 21, 2025

(54) MODULAR POWER DISTRIBUTION PANEL

(71) Applicant: Telect, Inc., Liberty Lake, WA (US)

(72) Inventors: Steven Kyle Witkoe, Liberty Lake, WA (US); Timothy Andrew Meyer, Colbert, WA (US); Timothy McBrien Turpin, Liberty Lake, WA (US)

(73) Assignee: Amphenol Network Solutions, Liberty Lake, WA (US)

( * ) Notice: Subject to any disclaimer, the term of this patent is extended or adjusted under 35 U.S.C. 154(b) by 95 days.

(21) Appl. No.: 18/074,823

(22) Filed: Dec. 5, 2022

(65) Prior Publication Data

US 2023/0187927 A1     Jun. 15, 2023

Related U.S. Application Data

(63) Continuation of application No. 17/170,572, filed on Feb. 8, 2021, now Pat. No. 11,522,359, which is a continuation of application No. 16/049,484, filed on Jul. 30, 2018, now Pat. No. 10,916,934.

(51) Int. Cl.
| | |
|---|---|
| *H02H 7/22* | (2006.01) |
| *H02B 1/18* | (2006.01) |
| *H02B 1/21* | (2006.01) |
| *H02B 1/28* | (2006.01) |
| *H02B 1/48* | (2006.01) |

(52) U.S. Cl.
CPC ............... *H02H 7/22* (2013.01); *H02B 1/18* (2013.01); *H02B 1/21* (2013.01); *H02B 1/28* (2013.01); *H02B 1/48* (2013.01)

(58) Field of Classification Search
CPC ... H02H 7/22; H02B 1/18; H02B 1/21; H02B 1/28; H02B 1/48
USPC .................................................... 361/63, 622
See application file for complete search history.

(56) References Cited

U.S. PATENT DOCUMENTS

| | | |
|---|---|---|
| 5,101,320 A | 3/1992 | Bhargava et al. |
| 5,224,020 A * | 6/1993 | Golledge ............ H05K 7/1449 361/679.48 |
| 5,289,363 A | 2/1994 | Ferchau et al. |
| 5,640,061 A | 6/1997 | Bornhorst et al. |
| 5,726,866 A | 3/1998 | Allen |
| 5,737,189 A | 4/1998 | Kammersgard et al. |
| 5,761,045 A | 6/1998 | Olson et al. |
| 5,896,273 A * | 4/1999 | Varghese ................ G06F 1/181 361/679.33 |
| 5,969,938 A | 10/1999 | Byrne et al. |
| 6,018,456 A | 1/2000 | Young et al. |
| 6,205,029 B1 | 3/2001 | Byrne et al. |

(Continued)

OTHER PUBLICATIONS

Non Final Office Action dated Jun. 30, 2020 for U.S. Appl. No. 16/049,484, "Modular Power Distribution Panel", Witkoe, 11 pages.

(Continued)

*Primary Examiner* — Anatoly Vortman
(74) *Attorney, Agent, or Firm* — Lee & Hayes, P.C.

(57) ABSTRACT

A power distribution panel for distributing power to a plurality of components. A modular frame may removably attach in an aperture of a side of a chassis. A first module may be removably attached in an opening of the modular frame. A second module, different from the first module, may be removably attached in the opening of the modular frame.

20 Claims, 22 Drawing Sheets

(56) References Cited

U.S. PATENT DOCUMENTS

| | | |
|---|---|---|
| 6,392,901 B1 | 5/2002 | Colver et al. |
| 6,442,017 B1 | 8/2002 | Ewing et al. |
| 6,456,203 B1 | 9/2002 | Schomaker et al. |
| 6,513,770 B1 * | 2/2003 | Franz .................. G02B 6/4471 |
| | | 312/223.1 |
| 6,905,372 B2 | 6/2005 | Cabrera et al. |
| 6,947,287 B1 | 9/2005 | Zansky et al. |
| 6,999,305 B1 * | 2/2006 | Calcote .................. H02B 1/01 |
| | | 361/603 |
| 7,005,996 B2 * | 2/2006 | Cabrera ................ H05K 7/186 |
| | | 361/636 |
| 7,173,821 B2 | 2/2007 | Coglitore |
| 7,898,787 B2 * | 3/2011 | Johnsen ................ H01R 13/68 |
| | | 361/119 |
| 7,907,416 B2 | 3/2011 | He et al. |
| 8,305,739 B2 | 11/2012 | Dozier |
| 8,737,076 B2 | 5/2014 | Wright et al. |
| 9,007,745 B1 | 4/2015 | Flegel |
| 10,401,923 B2 | 9/2019 | Chuang et al. |
| 2004/0113804 A1 | 6/2004 | Cabrera et al. |
| 2005/0170678 A1 * | 8/2005 | Donahue ............. H01R 13/514 |
| | | 439/214 |
| 2005/0207129 A1 | 9/2005 | Fiorentino et al. |
| 2006/0120001 A1 | 6/2006 | Weber et al. |
| 2008/0136259 A1 * | 6/2008 | Coffey .................... H02B 1/04 |
| | | 307/11 |
| 2010/0149731 A1 * | 6/2010 | Hopper ............... F21V 23/0435 |
| | | 361/627 |
| 2020/0036184 A1 | 1/2020 | Witkoe et al. |
| 2021/0234367 A1 | 7/2021 | Witkoe et al. |

OTHER PUBLICATIONS

Office Action for U.S. Appl. No. 17/170,572, mailed Jun. 1, 2022, Witkoe, "Modular Power Distribution Panel", 7 pages.

\* cited by examiner

MODULAR POWER DISTRIBUTION PANEL

RELATED APPLICATIONS

This application claims priority to and is a continuation of U.S. patent application Ser. No. 17/170,572, filed on Feb. 8, 2021, which claims priority to and is a continuation of U.S. patent application Ser. No. 16/049,484, filed on Jul. 30, 2018, the entire contents of which are incorporated herein by reference.

BACKGROUND

Industry-wide, the design of power distribution systems is essentially non-standardized. As such, secondary power distribution system components, made by data communication manufacturers, are customized for each application. In view of the non-standardization, each secondary power distribution system requires a unique manufacturing line to build, increasing cost. Specifically, each of the non-standardized secondary power distribution systems may require a specific chassis, specific components, and specific tools to manufacture. This increases the cost of manufacturing the secondary power distribution systems. Accordingly, there remains a desire to standardize power distribution equipment to not require a specific chassis, specific components, or specific tools to manufacture, and thus reduce cost.

SUMMARY

Power distribution panels for distributing power to a plurality of direct current (DC) equipment coupled to a rack are described herein. More specifically, this disclosure relates to power distribution panels that have a modular frame which is removably attachable in an opening located in a side of a chassis. This summary is provided to introduce simplified concepts of power distribution panels, which are further described below in the Detailed Description. This summary is not intended to identify essential features of the claimed subject matter, nor is it intended for use in determining the scope of the claimed subject matter.

In an embodiment, a power distribution panel includes a chassis and a modular frame. The modular frame may be removably attachable in an aperture of a back side of the chassis. A first module may be removably attachable in an opening of the modular frame, and a second module may be removably attachable in the opening of the modular frame.

In an embodiment, a power distribution panel includes a modular frame removably attachable in an aperture of a side of a chassis. An input module may be removably attachable in an opening of the modular frame. The input module may attach the power distribution panel to power input cables and to power return cables attached to a primary power distribution system. An output module may also be removably attachable in the opening of the modular frame. The output module may attach the power distribution panel to power output lines and to power return lines attached to a plurality of DC equipment coupled to a rack.

In another embodiment, a power distribution panel includes a chassis having a front side and a back side opposite the front side. A plurality of overcurrent protection device holders may be arranged in the front side of the chassis that removably receives a plurality of overcurrent protection devices. A modular frame may be removably attachable in an aperture of the back side of the chassis. First and second modules may be removably attachable in an opening of the modular frame. A plurality of internal power lines may be arranged inside of the chassis from the front side of the chassis to the back side of the chassis. The first module and the second module may removably receive ends of the plurality of internal power lines.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

This disclosure is directed to power distribution panels having a modular frame removably attachable in a chassis, where first and second modules are removably attachable in the modular frame. Because the first and second modules are removably attachable in the modular frame, a user may quickly and easily configure the modular frame as desired. Moreover, because the modular frame is removably attachable to the chassis, a user may quickly and easily removably attach the modular frame to a chassis.

In another example, a power distribution panel includes a plurality of internal power lines arranged inside of the chassis from a front side of the chassis to the back side of the chassis, where the first and second modules removably receive ends of the plurality of internal power lines arranged inside of the chassis. Because the first and second modules removably receive ends of the plurality of internal power lines, a user may quickly and easily build the power distribution panel with fewer components and at a reduced cost.

Illustrative Power Distribution Panels

Figure 1:
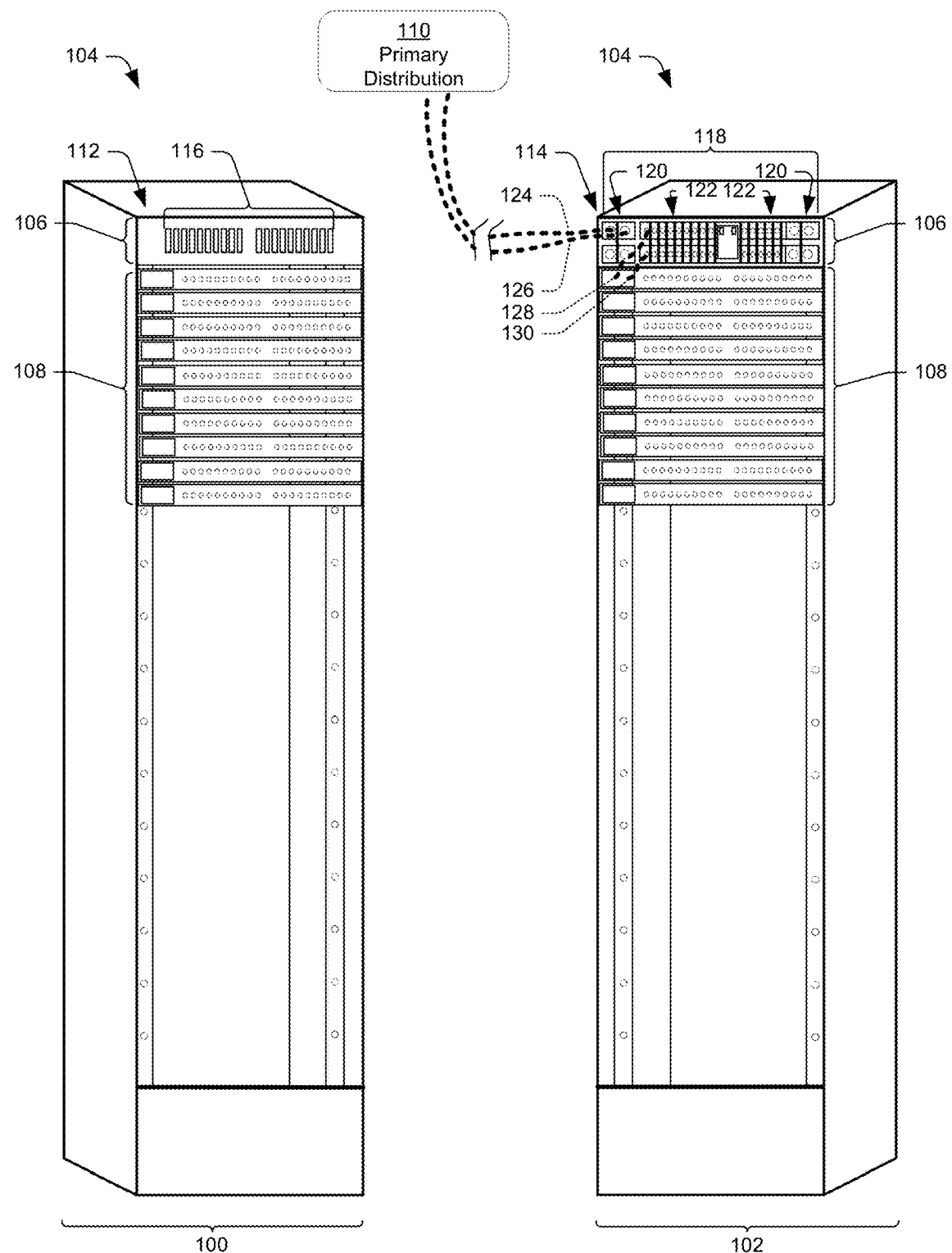
FIG. 1 illustrates a front view and a rear view of an exemplary rack populated with a power distribution panel according to an embodiment in this disclosure.

FIG. 1 illustrates a front view 100 and a back view 102 of an exemplary rack 104 populated with a power distribution panel 106. The rack 104 serves as a central location for connecting multiple direct current (DC) components 108. The power distribution panel 106 distributes power from a primary power distribution system 110. For example, the power distribution panel 106 may distribute power from a Battery Distribution Fuse Bay (BDFB) or Battery Distribution Circuit Breaker Bay (BDCBB). In an example embodiment, the primary power distribution system 110 may have input capacities of 8000 amps and outputs circuits up to 450 amps, and the power distribution panel 106 may be a secondary distribution system that receives power from the BDFB/BDCBB and distributes power to each component 108 in the rack 104.

In one example, components 108 may be pieces of telecommunications equipment in a telecommunication network infrastructure that may be kept or maintained in the rack 104 (e.g. cabinet) within the telecommunication network infrastructure. In another example, components 108 may be pieces of equipment in a solar power infrastructure that may be kept or maintained in the rack 104 within the solar power infrastructure. Specific examples of components 108, may include fiber optic equipment, switches, digital cross connect (DSX) systems, telecommunication panels, terminal blocks, digital radios, network office terminating equipment, cross-connect panels, modules, splitters, combiners, backplanes, repeaters, and any other telecommunication equipment or devices employed in a telecommunications infrastructure. Generally, components 108 may be those devices utilized for processing and distributing signals in infrastructure and which may be maintained in the rack 104. Components 108 may terminate, interconnect, or cross-connect a plurality of network elements within infrastructure. For example, components 108 may be utilized to distribute telecommunications signals sent to and from the infrastructure by one or more end-users using an end-user device. The interconnections between telecommunications equipment provide signal pathways for telecommunications signals (e.g., optical signals, electrical signals, digital signals, and/or analog signals). Interconnection may be via one or more components 108, such as by adapters on a module, connectors on a module, or may be internal to the components 108, such as via a printed circuit board within a component 108. With respect to the power distribution panel 106, each component 108 may be considered a load.

Front view 100 illustrates a modular face plate assembly 112 of the power distribution panel 106, and back view 102 illustrates a modular frame assembly 114 of the power distribution panel 106 opposite the modular face plate assembly 112 of the power distribution panel 106. The modular face plate assembly 112 of the power distribution panel 106 may be disposed proximate to a first portion (e.g., a front portion) of the rack 104.

Front view 100 illustrates the power distribution panel 106 may have a plurality of overcurrent protection device holders 116 arranged in the modular face plate assembly 112 of the power distribution panel 106. The plurality of overcurrent protection device holders 116 may be configured to hold GMT "grasshopper" fuses, KTK, KLM, and/or snapak breakers (e.g., low current overcurrent protection devices), TPS, TPA fuses and/or circuit breakers (medium current overcurrent protection devices), TPC and/or TLS fuses (e.g., high current overcurrent protection devices), etc., suitable for telecommunications applications. The power distribution panel 106 may include any number of plurality of overcurrent protection device holders 116. For example, the power distribution panel 106 may include 10 overcurrent protection device holders 116. In another example, the power distribution panel 106 may include 5, 15, 20, or any quantity of overcurrent protection device holders 116. In an embodiment, the quantity of plurality of overcurrent protection device holders 116 may be based at least in part on how many components 108 a rack 104 is configured to house.

Back view 102 illustrates the modular frame assembly 114 of the power distribution panel 106 may be disposed proximate to a second portion (e.g., a back portion) of the rack 104. The modular frame assembly 114 of the power distribution panel 106 may include a modular frame 118, one or more first modules 120 removably attached in the modular frame 118, and one or more second modules 122, different from the one or more first modules 120, removably attached in the modular frame 118. The one or more first modules 120 may include one or more input modules to attach the power distribution panel 106 to one or more power input cables 124 and to one or more power return cables 126. The one or more power input cables 124 and the one or more power return cables 126 are attached to the primary power distribution system 110. The one or more second modules 122 may include one or more output modules to attach the power distribution panel 106 to one or more power output lines 128 and to one or more power return lines 130. The one or more power output lines 128 and the one or more power return lines 130 are attached to one or more of the plurality of telecommunications equipment 108. The one or more second modules 122 (e.g., output modules) may be electrically interconnected with the plurality of overcurrent protection device holders 116 (described in detail below).

Figure 2:
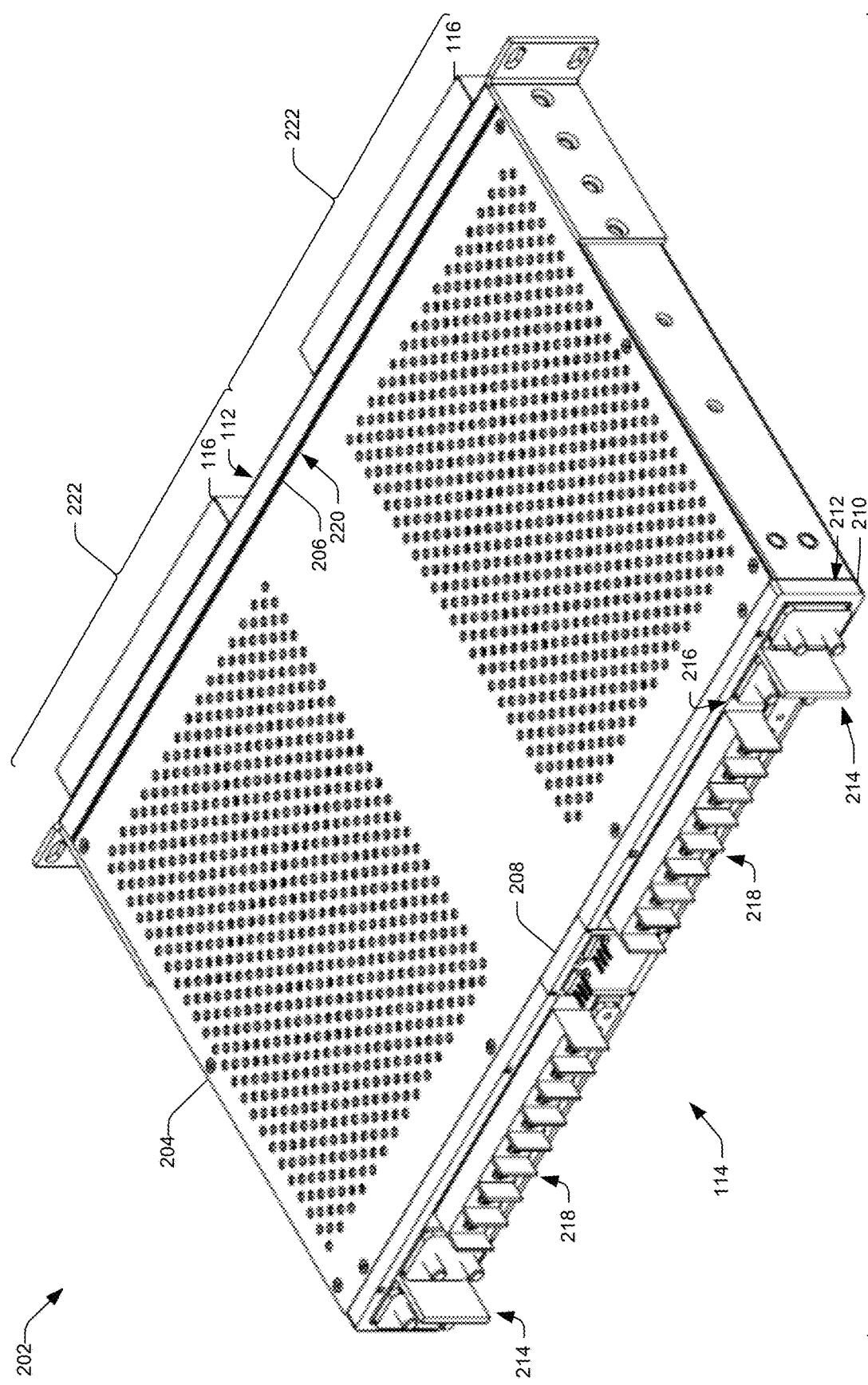
FIG. 2 illustrates a back perspective view of an example power distribution panel that may be implemented in the rack of FIG. 1 according to an embodiment in this disclosure.

FIG. 2 illustrates a back perspective view 200 of an example power distribution panel 202 that may be implemented in the rack 104 of FIG. 1. The power distribution panel 202 may be the same as the power distribution panel 106 discussed above. Inasmuch as FIG. 2 depicts the power distribution panel 202 implementable in the rack 104 of FIG. 1, while referring to the same elements and features of the power distribution panel 202, the following discussion of specific features may refer to FIG. 1 except where explicitly indicated. In particular, FIG. 2 illustrates an embodiment of the power distribution panel 202, including the modular face plate assembly 112 and the modular frame assembly 114.

FIG. 2 illustrates the power distribution panel 202 including a chassis 204. The chassis has a front side 206 and a back side 208 opposite the front side 206. The chassis 204 may have a 1 RU (rack unit) height. The modular frame assembly 114 may include a modular frame 210 removably attachable in an aperture 212 of the back side 208 of the chassis 204. One or more first modules 214 may be removably attachable in an opening 216 of the modular frame 210. One or more second modules 218, different from the one or more first modules 214, may be removably attachable in the opening 216 of the modular frame 210. Similar to the one or more first modules 120 and the one or more second modules 122 discussed above with regard to FIG. 1, the one or more first modules 214 may include input modules to attach the power distribution panel 202 to the one or more power input cables 124 and to the one or more power return cables 126, and the one or more second modules 218 may include output modules to attach the power distribution panel 202 to the one or more power output lines 128 and to the one or more power return lines 130.

In one example, the one or more first modules 214 may include a low current input module via which the power distribution panel 202 receives about 125 amperes from the power input cables 124 and the power return cables 126 attached to the primary power distribution system 110. In another example, the one or more first modules 214 may include medium current input modules via which the power distribution panel 202 receives about 300 amperes from the power input cables 124 and the power return cables 126 attached to the primary power distribution system 110. In another example, the one or more first modules 214 may include high current input modules via which the power distribution panel 202 receives about 600 amperes from the power input cables 124 and the power return cables 126 attached to the primary power distribution system 110.

In one example, the one or more second modules 218 may include low current output modules via which the power distribution panel 202 outputs about 30 amperes to the power output lines 128 and the power return lines 130 attached to the telecommunications equipment 108. In another example, the one or more second modules 218 may include medium current output modules via which the power distribution panel 202 outputs about 100 amperes to the power output lines 128 and the power return lines 130 attached to the telecommunications equipment 108. In another example, the one or more second modules 218 may include low and medium current output modules via which the power distribution panel 202 outputs about 30 amperes and 100 amperes to the power output lines 128 and the power return lines 130 attached to the telecommunications equipment 108. In another example, the one or more second modules 218 may include high current output modules via which the power distribution panel 202 outputs about 250 amperes to the power output lines 128 and the power return lines 130 attached to the telecommunications equipment 108.

FIG. 2 illustrates the modular face plate assembly 112 may be removably attachable in an aperture 220 located in the front side 206 of the chassis 204. In one example, the modular face plate assembly 112 may include a low current modular face plate having the plurality of overcurrent protection device holders 116 to removably receive a plurality of low current overcurrent protection devices (e.g., GMT "grasshopper" fuses, KTK, KLM, and/or snapak breakers). In another example, the modular face plate assembly 112 may include a medium current modular face plate having the plurality of overcurrent protection device holders 116 to removably receive a plurality of medium current overcurrent protection devices (e.g., TPS, TPA fuses and/or circuit breakers). In another example, the modular face plate assembly 112 may include a low and medium current modular face plate having the plurality of overcurrent protection device holders 116 to removably receive a plurality of low current overcurrent protection devices and a plurality of medium current overcurrent protection devices. In another example, the modular face plate assembly 112 may include a high current modular face plate having the plurality of overcurrent protection device holders 116 to removably receive a plurality of high current overcurrent protection devices (e.g., TPC and/or TLC fuses).

FIG. 2 illustrates the power distribution panel 202 may include redundant sides 222. Redundant sides 222 may be symmetrical mirror images of each other and may be configured to provide redundancy power distribution in the rack 104. Each redundant side 222 may include a first module 214, a second module 218, and about half of the overcurrent protection device holders 116 arranged in the modular face plate assembly 112.

Figure 3:
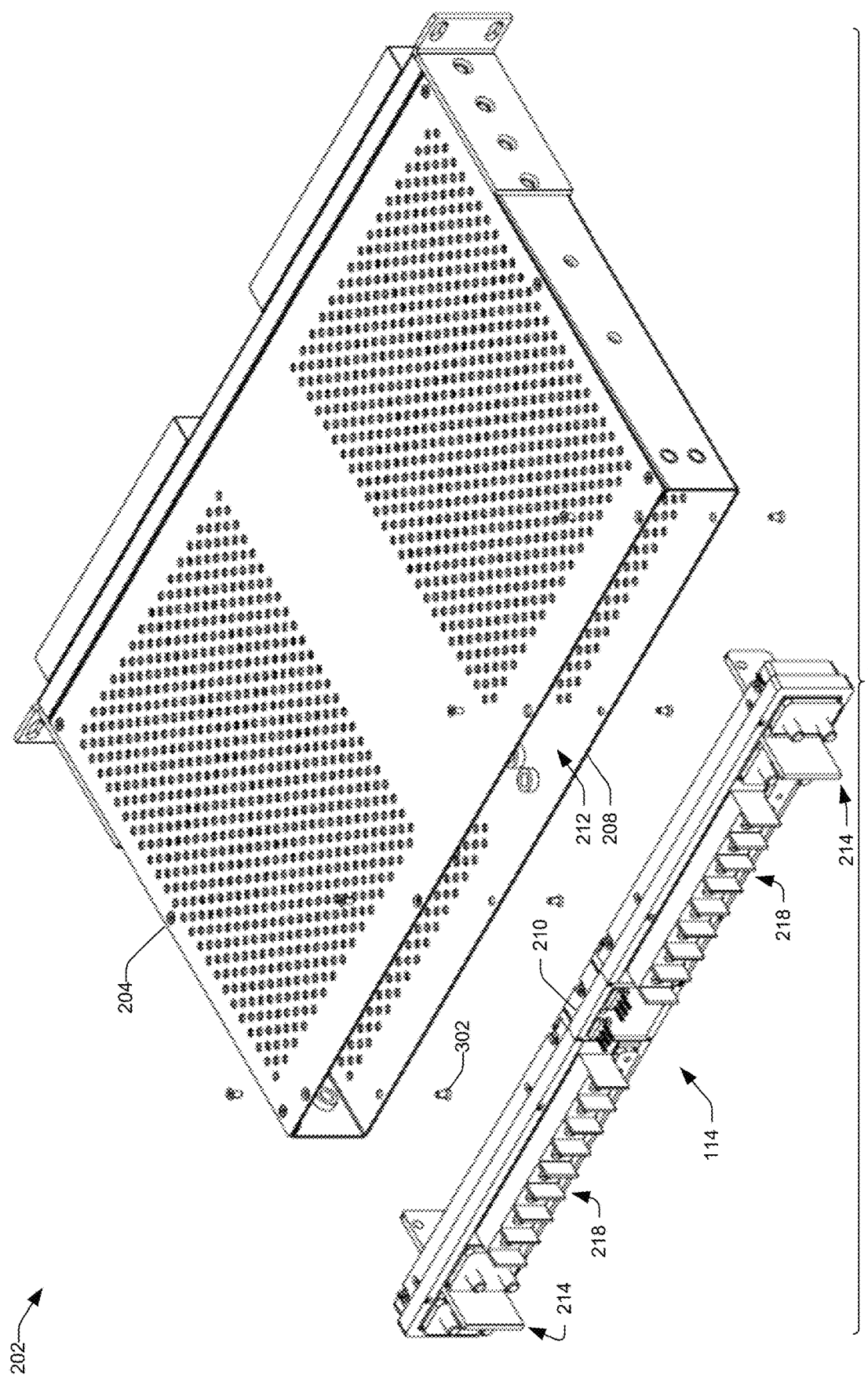
FIG. 3 illustrates a perspective view of a modular frame assembly removably detached from an aperture of a back side of a chassis according to an embodiment in this disclosure.

FIG. 3 illustrates a perspective view 300 of the modular frame assembly 114 removably detached from the aperture 212 of the back side 208 of the chassis 204. While FIG. 3 illustrates fasteners 302 (e.g., screws, bolts, etc.) may removably attach the modular frame assembly 114 in the aperture 212 of the back side 208 of the chassis 204, the modular frame assembly 114 may be removably attached to the back side 208 of the chassis 204 via an interference fit, a press fit, a friction fit, a snap fit, etc.

Figure 4:
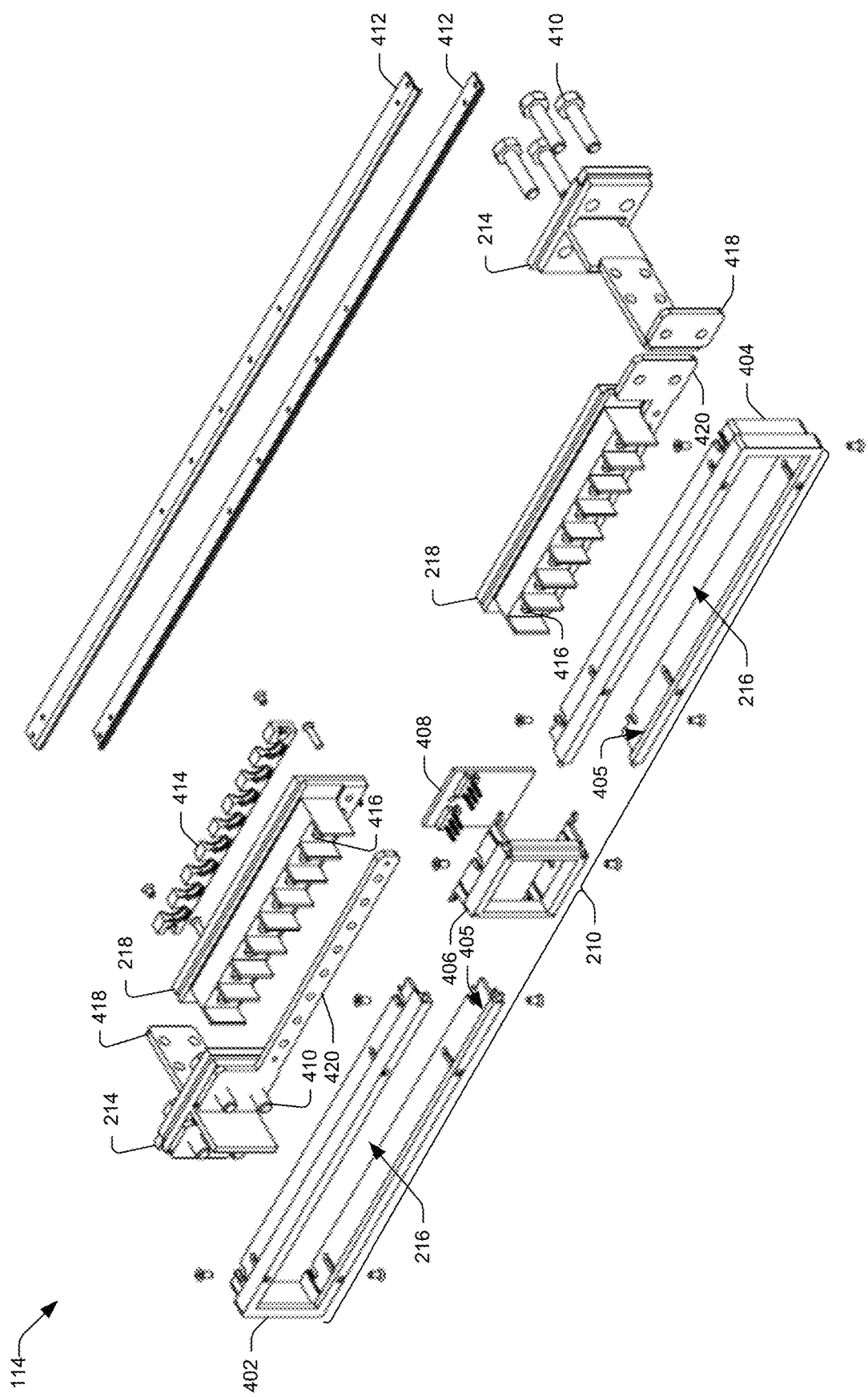
FIG. 4 illustrates an exploded assembly view of the modular frame assembly, in FIG. 3, according to an embodiment in this disclosure.

FIG. 4 illustrates an exploded assembly view 400 of the modular frame assembly 114. The modular frame 210 may include a first member 402 and a second member 404 couplable to the first member 402. The ends of the first member 402 may attach to the ends of the second member 404. For example, the ends of the first member 402 may interference fit, press fit, friction fit, snap fit, etc. to the second member 404 to form the modular frame 210. In another example, the ends of the first member 402 may attach to the ends of the second member 404 via one or more threaded fasteners. In an embodiment, the modular frame 210 may include a third member 406. The third member 406 may provide for retaining a printed circuit board (PCB) 408. The PCB 408 may be an alarm PCB board. The ends of the first and second members 402 and 404 may attach to the sides of the third member 406. For example, the ends of the first and second members 402 and 404 may interference fit, press fit, friction fit, snap fit etc. to the sides of the third member 406 to form the modular frame 210.

The first and second members 402 and 404 may include the opening 216 therethrough. The one or more first modules 214 and the one or more second modules 218 may be removably attached to the modular frame 210 through the opening 216. For example, the opening 216 may slideably receive the one or more first modules 214 and the one or more second modules 218, and thereafter the one or more first modules 214 and the one or more second modules 218 may be fastened to the modular frame 210. For example, the one or more first modules 214 and the one or more second modules 218 may be removeably attached to an inner surface 405 of the module frame 210.

A user may select a type of the one or more first modules 214 to be removably attached in the opening 216 of the modular frame 210 depending on whether the power distribution panel 202 is to be configured as a low current power distribution panel, a medium current power distribution panel, a low current and medium current power distribution panel, or a high current power distribution panel. For example, a user may select a low current type input module to be removably attached in the opening 216 when the power distribution panel 202 is to be configured as a low current power distribution panel. In another example, a user may select a medium current type input module to be removably attached in the opening 216 when the power distribution panel 202 is to be configured as a medium current power distribution panel. In another example, a user may select a medium current type input module to be removably attached in the opening 216 when the power distribution panel 202 is to be configured as a low and medium current power distribution panel. In another example, a user may select a high current type input module to be removably attached in the opening 216 when the power distribution panel 202 is to be configured as a high current power distribution panel.

The one or more first modules 214 may include one or more fasteners 410. The fasteners 410 may be bolts or self-clinching fasteners that may removably attach the one or more first modules 214 in the opening 216. For example, one or more bolts and/or one or more self-clinching fasteners may be used to removably attach the one or more first modules 214 in the opening rather than using one or more threaded headless fasteners (e.g., one or more studs). The one or more fasteners 214 may connect the one or more first modules 214 to the one or more power input cables 124 and/or the one or more power return cables 126 rather than using one or more threaded headless fasteners (e.g., one or more studs).

In one example, a low current type input module may include one or more fasteners having a smaller size than a size of fasteners of the medium current type input module. In another example, a medium current type input module may include fasteners having a smaller size than a size of fasteners of the high current type input module. A low current type fastener may have an outside diameter of about 0.25 inches and 0.625 inch spacing. A medium current type fastener may have an outside diameter of about 0.375 inches and 0.75 inch spacing. A high current type fastener may have an outside diameter of about 0.375 inches and 1.00 inch spacing. The power input cables and the power return cables may attach to the fasteners.

In another example, a low current type input module may be void of fasteners and may include openings to removably receive ends of internal power lines arranged inside of the chassis 204. The power input cables and the power return cables may attach to the ends of the internal power lines removably received in the openings of the low current type input module.

Moreover, in addition to selecting a type of the one or more first modules 214 to be removably attached in the opening 216 of the modular frame 210, a user may select a type of the one or more second modules 218 to be removably attached in the opening 216 of the modular frame 210 depending on whether the power distribution panel 202 is to be configured as a low current power distribution panel, a medium current power distribution panel, a low current and medium current power distribution panel, or a high current power distribution panel. For example, a user may select a low current type output module to be removably attached in the opening 216 when the power distribution panel 202 is to be configured as a low current power distribution panel. In another example, a user may select a medium current type output module to be removably attached in the opening 216 when the power distribution panel 202 is to be configured as a medium current power distribution panel. In another example, a user may select a low current and medium current type output module to be removably attached in the opening 216 when the power distribution panel 202 is to be configured as a low current and medium current power distribution panel. In another example, a user may select a high current type output module to be removably attached in the opening 216 when the power distribution panel 202 is to be configured as a high current power distribution panel.

In one example, a low current type output module may include openings having an inside diameter smaller than a size of an inside diameter of a medium current type output module. In another example, a medium current type output module may include openings having an inside diameter smaller than a size of an inside diameter of a high current type output module. In another example, a low current and medium current type output module may include a first plurality of openings having an inside diameter smaller than an inside diameter of a second plurality of openings. The second plurality of openings having an inside diameter smaller than an inside diameter of a plurality of openings of a high current type output module.

A low current type opening may have an inside diameter of about 0.138 inches. A medium current type opening may have an inside diameter of about 0.190 inches. A high current type opening may have an inside diameter of about 0.25 inches. The low current type openings may have the inside diameter of about 0.138 inches so that each opening of the plurality of openings may removably receive a respective end of ends of internal power lines (e.g., 14-gauge sized power line) sized to carry the low current. The medium current type openings may have the inside diameter of about 0.190 inches so that each opening of the plurality of openings may removably receive a respective end of ends of internal power lines (e.g., 8-gauge sized power line) sized to carry the medium current. The high current type openings may have the inside diameter of about 0.25 inches so that each opening of the plurality of openings may removably receive a respective end of ends of internal power lines (e.g., 4-gauge sized power line) sized to carry the high current.

One or more brackets 412 may provide for attaching the first modules 214 and the second modules 218 to the modular frame 210. For example, the one or more brackets 412 may fasten to a top and bottom of the modular frame 210 to secure the first modules 214 and the second modules 218 in the opening 216 of the modular frame 210.

One or more brackets 414 may provide for retaining the respective end of the ends of internal power lines in respective openings 416 of the one or more second modules 218. For example, the one or more brackets 414 may fasten to a back surface of the one or more second modules 218 to secure ends of the internal power lines in the respective openings 416 of the one or more second modules 218. The ends of the internal power lines secured in the respective openings 416 of the one or more second modules 218 may provide for connecting the one or more second modules 218 to the one or more power output lines 128. For example, the ends of the internal power lines secured in the respective openings 416 of the one or more second modules 218 may provide for connecting the one or more second modules 218 to the one or more power output lines 128 rather than using one or more threaded headless fasteners (e.g., one or more studs).

The modular frame assembly 114 may include a battery busbar 418 and a return busbar 420. The battery busbar 418 may provide for attaching the one or more power input cables 124 to one or more internal power lines (not shown) arranged inside of the chassis 204. The one or more internal power lines may be attached to the battery busbar 418 and attached to one or more overcurrent protection device busbars (discussed in more detail below). The return busbar 420 may provide for attaching the one or more power return cables 126 to the one or more power return lines 130.

Figure 5:
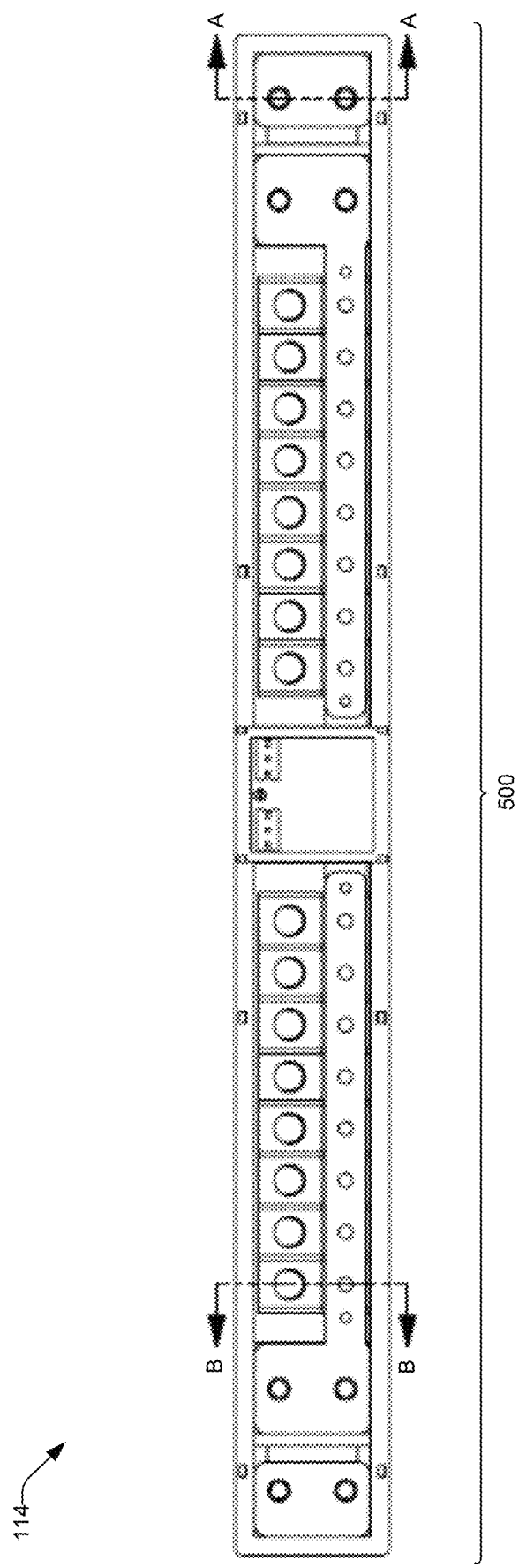
FIG. 5 illustrates a front view of the modular frame assembly according to an embodiment in this disclosure.

FIG. 5 illustrates a front view 500 of the modular frame assembly 114 depicting cross-section lines A-A and B-B.

Figure 6:
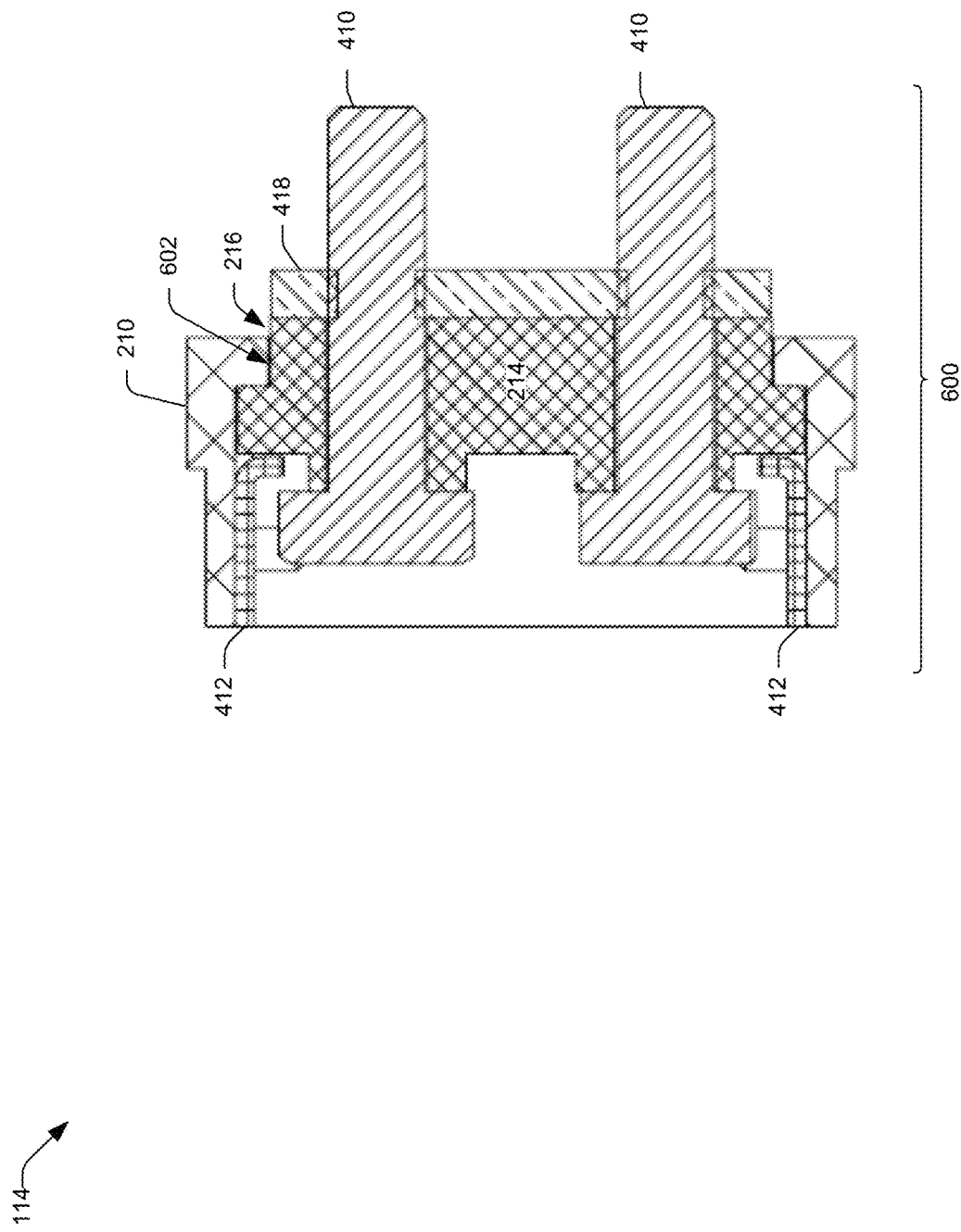
FIG. 6 illustrates a section view of the modular frame assembly taken along line A-A, in FIG. 5, through a first module according to an embodiment in this disclosure.

FIG. 6 illustrates a section view 600 of the modular frame assembly 114 taken along line A-A through one of the one or more first modules 214. The section view 600 illustrates the one or more first modules 214 may be removably attachable in the opening 216 of the modular frame 210. For example, the one or more first modules may removeably attach to a first inner surface 602 of the modular frame 210. The one or more brackets 412 are shown attaching the one or more first modules 214 to the modular frame 210. The one or more fasteners 410 are shown passing through the one or more first modules 214 and the battery busbar 418.

Figure 7:
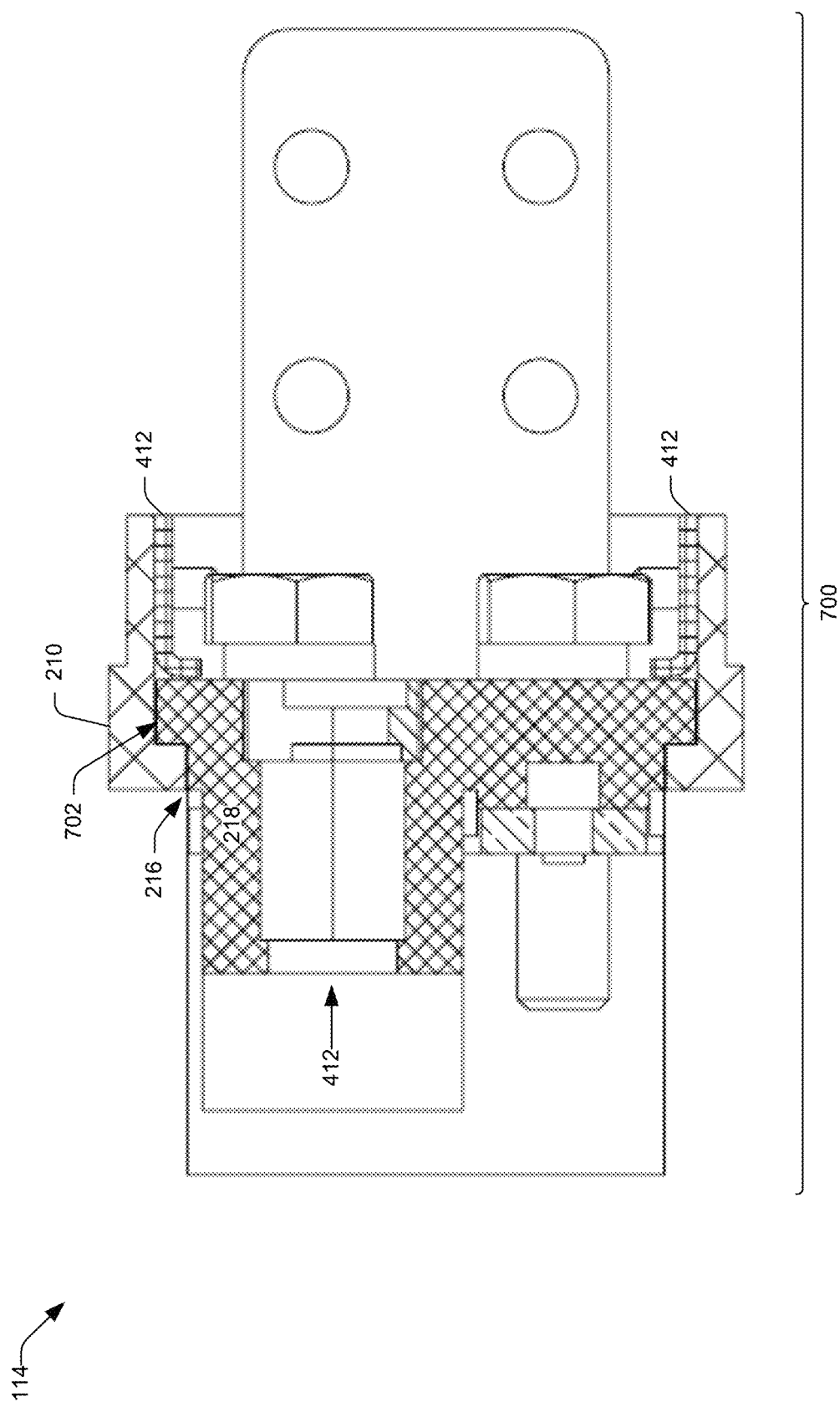
FIG. 7 illustrates a section view of the modular frame assembly taken along line B-B, in FIG. 5, through a second module according to an embodiment in this disclosure.

FIG. 7 illustrates a section view 700 of the modular frame assembly 114 taken along line B-B through one of the one or more second modules 218. The section view 700 illustrates the one or more second modules 218 may be removably attachable in the opening 216 of the modular frame 210. For example, the one or more second modules 218 may removeably attach to a second inner surface 702 of the modular frame 210. The one or more brackets 412 are shown attaching the one or more second modules 218 to the modular frame 210.

Figure 8:
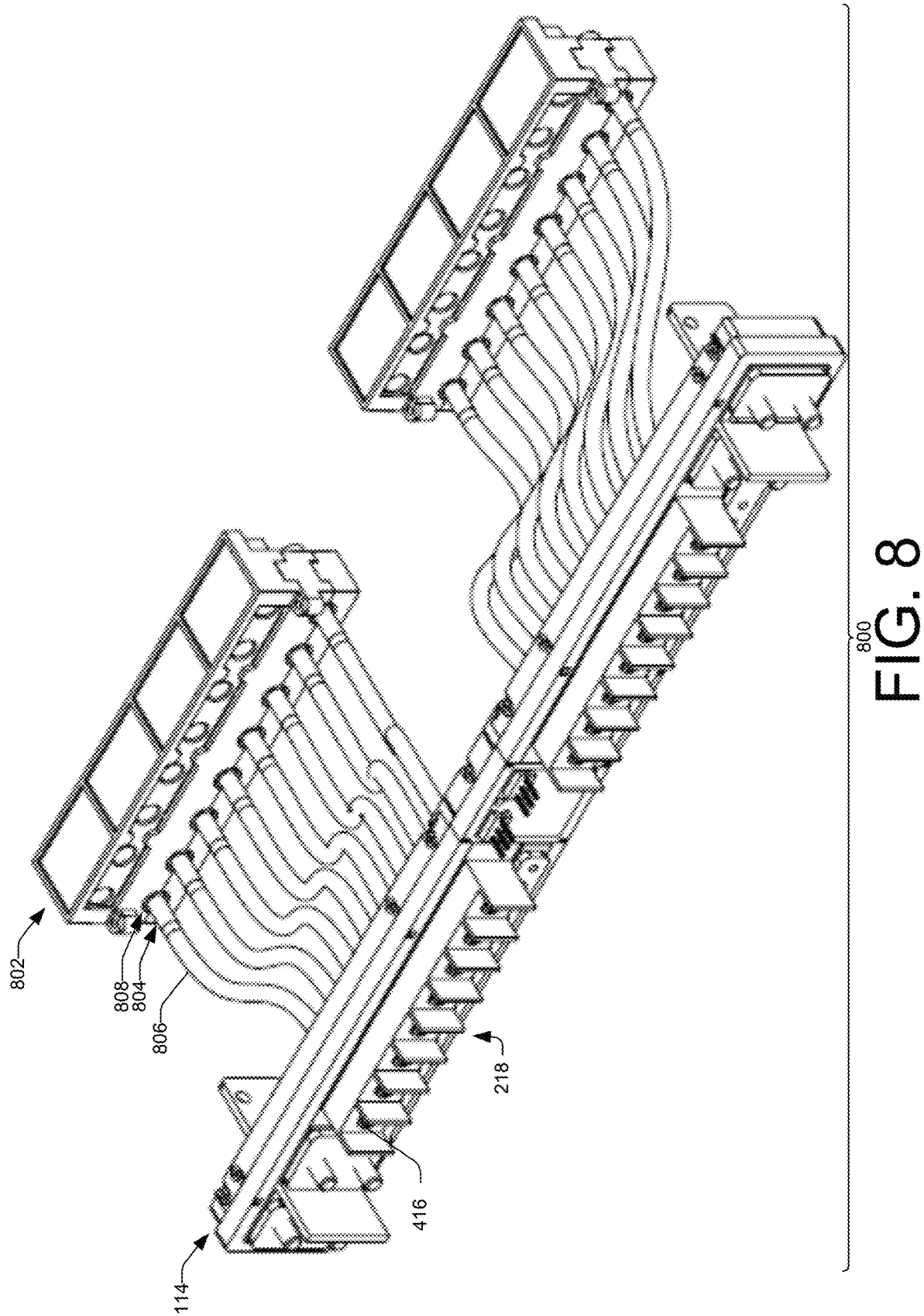
FIG. 8 illustrates a back perspective view of the modular frame assembly and one or more overcurrent protection device busbars according to an embodiment in this disclosure.

FIG. 8 illustrates a back perspective view 800 of the modular frame assembly 114 and one or more overcurrent protection device busbars 802. The one or more overcurrent protection device busbars 802 may removably receive a respective end 804 of internal power lines 806. For example, the one or more overcurrent protection device busbars 802 may include a plurality of openings 808 arranged therein, and each end 804 of the internal power lines 806 may be removably received by a respective opening of the plurality of openings 808 of the one or more overcurrent protection device busbars 802. The one or more overcurrent protection device busbars 802 may attach to overcurrent protection devices held by the plurality of overcurrent protection device holders 116 arranged in the modular face plate assembly 112 (described in more detail below).

Figure 9:
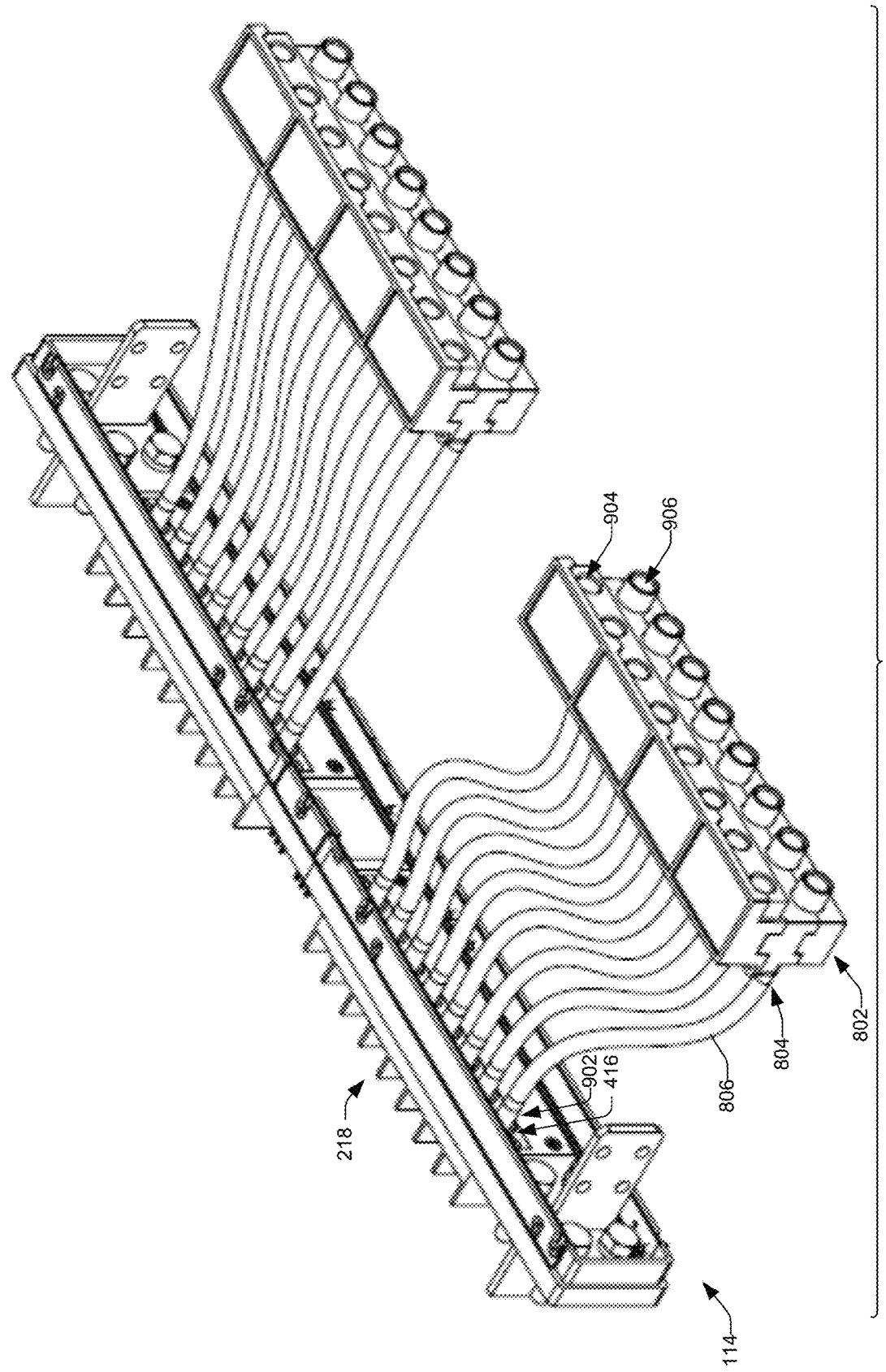
FIG. 9 illustrates a front perspective view of the modular frame assembly and the one or more overcurrent protection device busbars according to an embodiment in this disclosure.

FIG. 9 illustrates a front perspective view 900 of the modular frame assembly 114 and the one or more overcurrent protection device busbars 802. FIG. 9 illustrates each opening of the plurality of openings 416 may removably receive a respective end 902 of the internal power lines 806. For example, each end 902 of the internal power lines 806, opposite the ends 804 of the internal power lines 806, may be removably received by a respective opening of the plurality of openings 416 of the one or more second modules 218. The one or more overcurrent protection device busbars 802 may include power input connections 904 and power output connections 906 that couple with the power input connections and power output connections of overcurrent protection devices. For example, each pair of a power input connection and a power output connection may cooperatively couple with a respective pair of a power input connection and power output connection of an overcurrent protection device.

Figure 10:
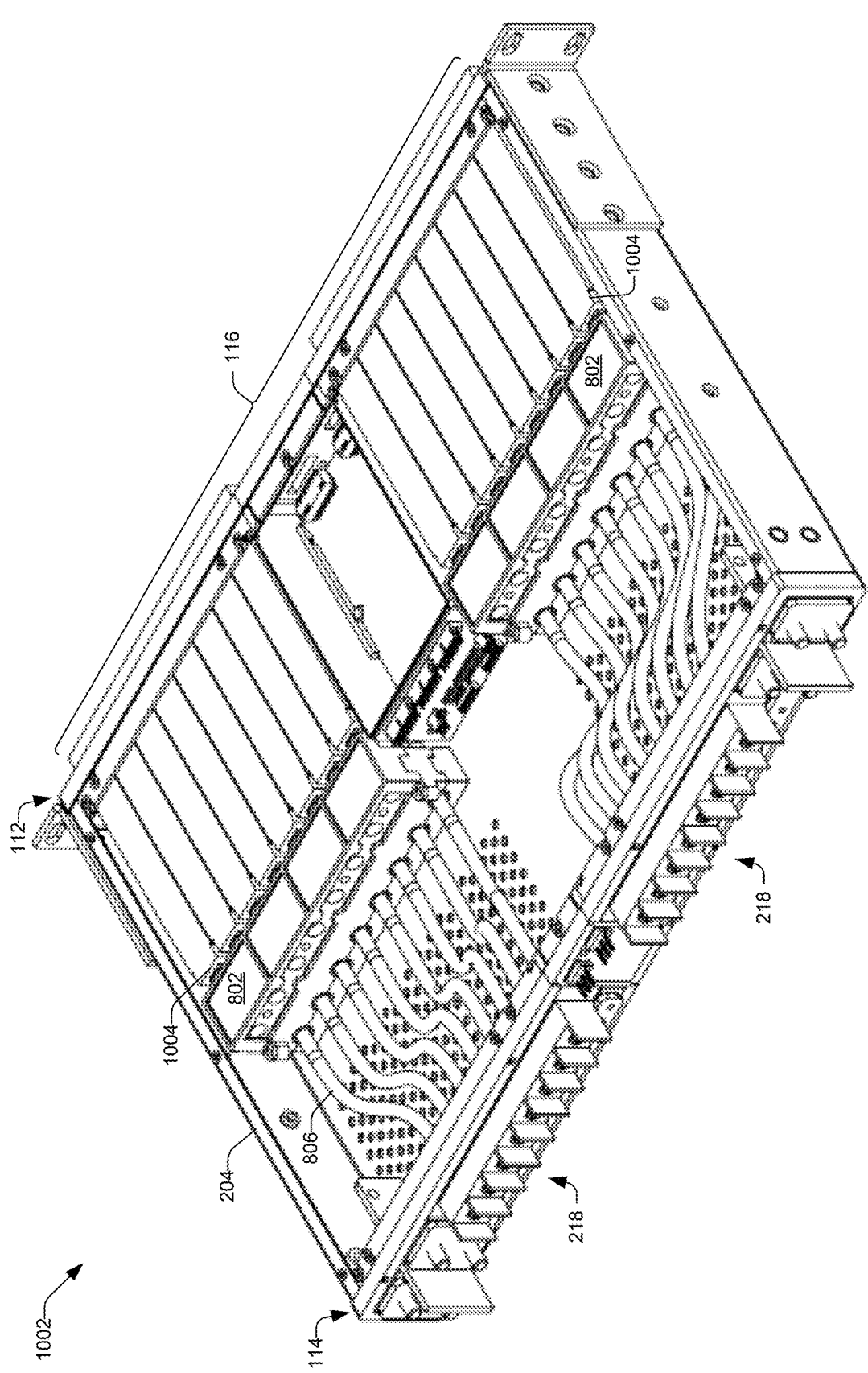
FIG. 10 illustrates a back perspective view of an example power distribution panel without a lid (not shown) according to an embodiment in this disclosure.

FIG. 10 illustrates a back perspective view 1000 of an example power distribution panel 1002 without a lid (not shown). The example power distribution panel 1002 may be the same as the power distribution panel 202 illustrated in FIG. 2. FIG. 10 illustrates the modular frame assembly 114, the one or more overcurrent protection device busbars 802, and the internal power lines 806 arranged in the chassis 204 of the power distribution panel 1002. One or more overcurrent protection devices 1004 may be coupled to the one or more overcurrent protection device busbars 802. The one or more overcurrent protection devices 1004 may be removably received by the plurality of overcurrent protection device holders 116 arranged in the modular face plate assembly 112. While FIG. 10 illustrates the one or more overcurrent protection devices 1004 may include one or more breaker type overcurrent protection devices coupled to the one or more overcurrent protection device busbars 802, other types of overcurrent protection devices may be coupled to the one or more overcurrent protection device busbars 802. For example, GMT "grasshopper fuses," TPS fuses, TPA fuses, TLS fuses, KTK fuses, KLM fuses, TPC fuses, snapak breakers, and/or circuit breakers may be coupled to the one or more overcurrent protection device busbars 802.

Figure 11:
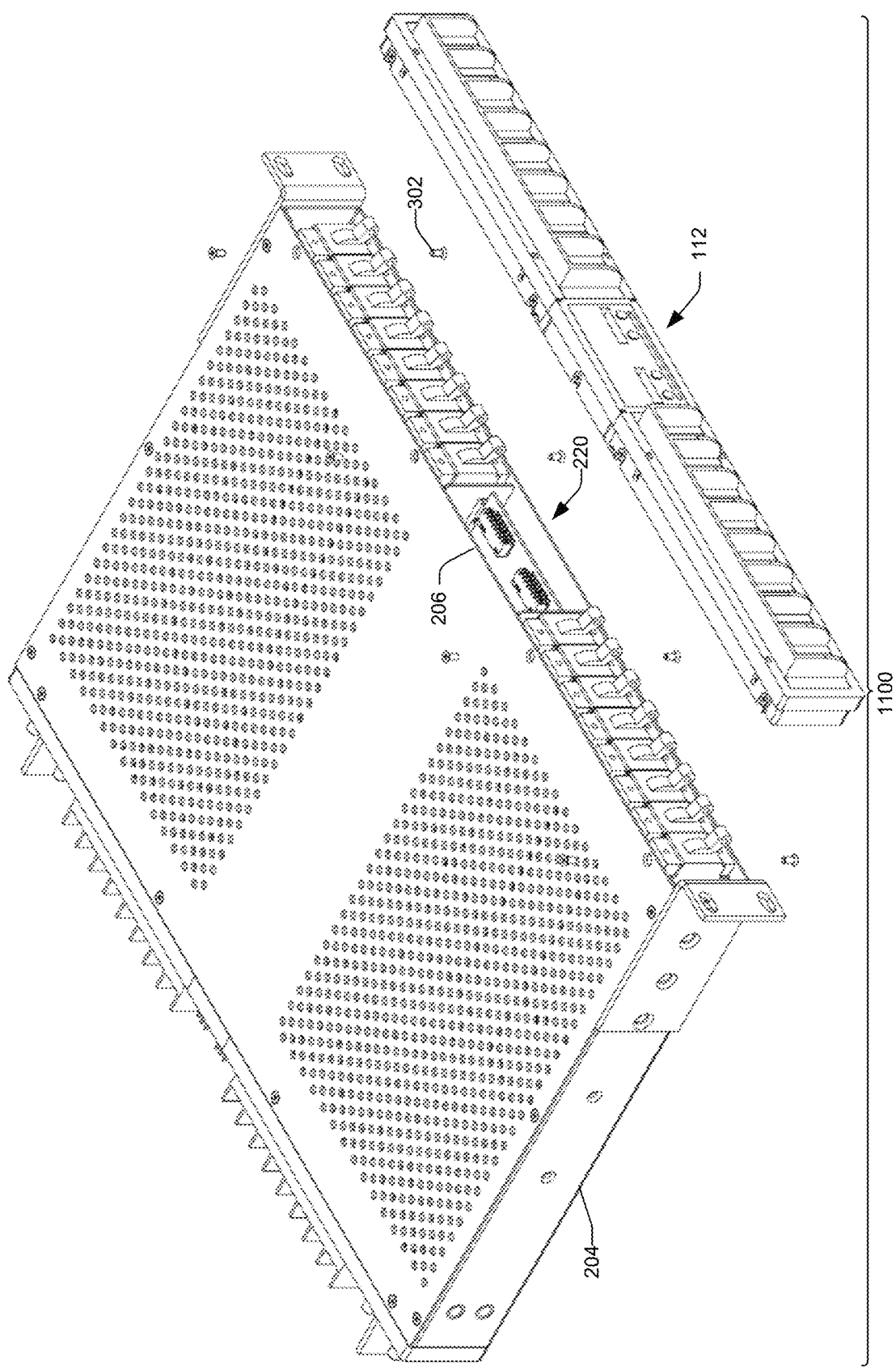
FIG. 11 illustrates a perspective view of the modular face plate assembly removably detached from an aperture of the front side of the chassis according to an embodiment in this disclosure.

FIG. 11 illustrates a perspective view 1100 of the modular face plate assembly 112 removably detached from the aperture 220 of the front side 206 of the chassis 204. While FIG. 11 illustrates the fasteners 302 (e.g., screws, bolts, etc.) may removably attach the modular face plate assembly 112 in the aperture 220 of the front side 206 of the chassis 204, the modular face plate assembly 112 may be removably attached to the front side 206 of the chassis 204 via an interference fit, a press fit, a friction fit, a snap fit, etc.

Figure 12:
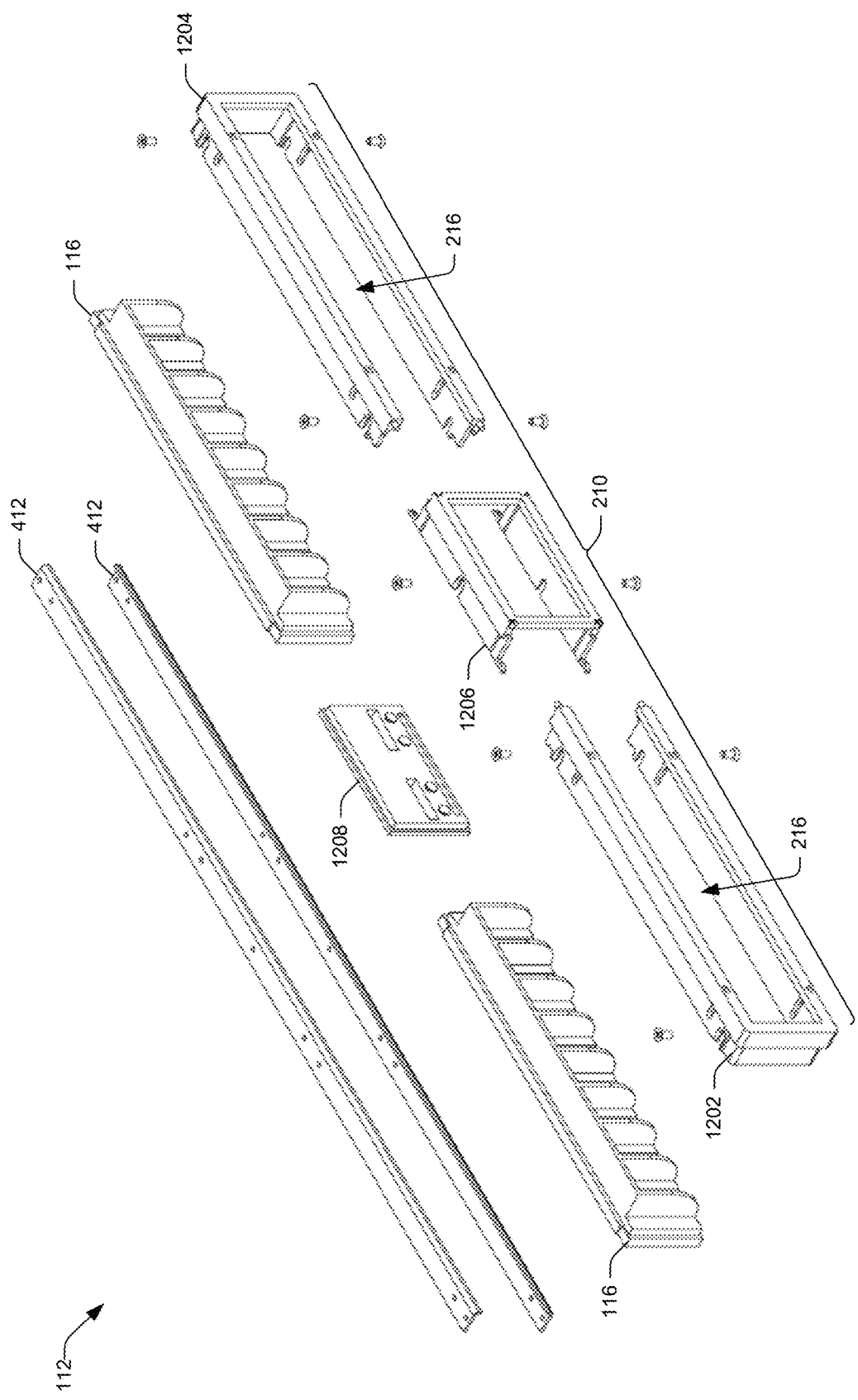
FIG. 12 illustrates an exploded assembly view of the modular face plate assembly according to an embodiment in this disclosure.

FIG. 12 illustrates an exploded assembly view 1200 of the modular face plate assembly 112. Similar to the modular frame assembly 114, the modular face plate assembly 112 may include the modular frame 210, a first member 1202, a second member 1204, and a third member 1206. The third member 1206 may provide for retaining a plate 1208. The plate 1208 may be an alarm plate attachable to an alarm printed circuit board (PCB).

The opening 216 of the modular frame 210 may removably attach the plurality of overcurrent protection device holders 116 to the modular frame 210. For example, the opening 216 may slideably receive the plurality of overcurrent protection device holders 116, and thereafter the plurality of overcurrent protection device holders 116 may be fastened to the modular frame 210.

A user may select a type of the plurality of overcurrent protection device holders 116 to be removably attached in the opening 216 of the modular frame 210 depending on whether the power distribution panel 202 is to be configured as a low current power distribution panel, a medium current power distribution panel, a low current and medium current power distribution panel, or a high current power distribution panel. For example, a user may select a low current type overcurrent protection deice holder to be removably attached in the opening 216 when the power distribution panel 202 is to be configured as a low current power distribution panel. In another example, a user may select a medium current type overcurrent protection device holder to be removably attached in the opening 216 when the power distribution panel 202 is to be configured as a medium current power distribution panel. In another example, a user may select a low and medium current type overcurrent protection device holder to be removably attached in the opening 216 when the power distribution panel 202 is to be configured as a low and medium current power distribution panel. In another example, a user may select a high current type overcurrent protection device holder to be removably attached in the opening 216 when the power distribution panel 202 is to be configured as a high current power distribution panel.

A low current type overcurrent protection device holder may include openings having a size for receiving GMT "grasshopper" fuses, KTK, KLM, and/or snapak breakers. A medium current type overcurrent protection device holder may include openings having a size for receiving TPS, TPA fuses and/or circuit breakers. A low and medium current type overcurrent protection device holder may include openings having a first size for receiving GMT "grasshopper" fuses, KTK, KLM, and/or snapak breakers and a second size for receiving TPS, TPA fuses and/or circuit breakers. A high current type overcurrent protection device holder may include openings having a size for receiving TPC and/or TLS fuses.

The one or more brackets 412 may provide for attaching the plurality of overcurrent protection device holders 116 to the modular frame 210. For example, the one or more brackets 412 may fasten to a top and bottom of the modular frame 210 to secure the plurality of overcurrent protection device holders 116 in the opening 216 of the modular frame 210.

Figure 13:
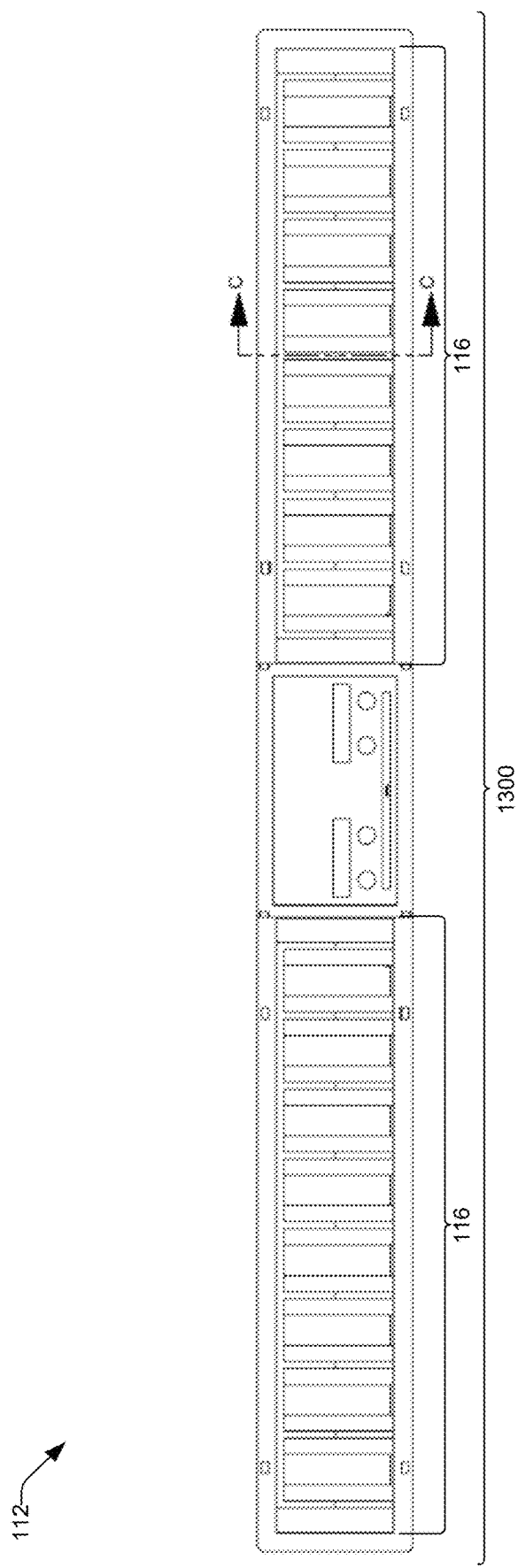
FIG. 13 illustrates a front view of the modular face plate assembly according to an embodiment in this disclosure.

FIG. 13 illustrates a front view 1300 of the modular face plate assembly 112 depicting cross-section line C-C.

Figure 14:
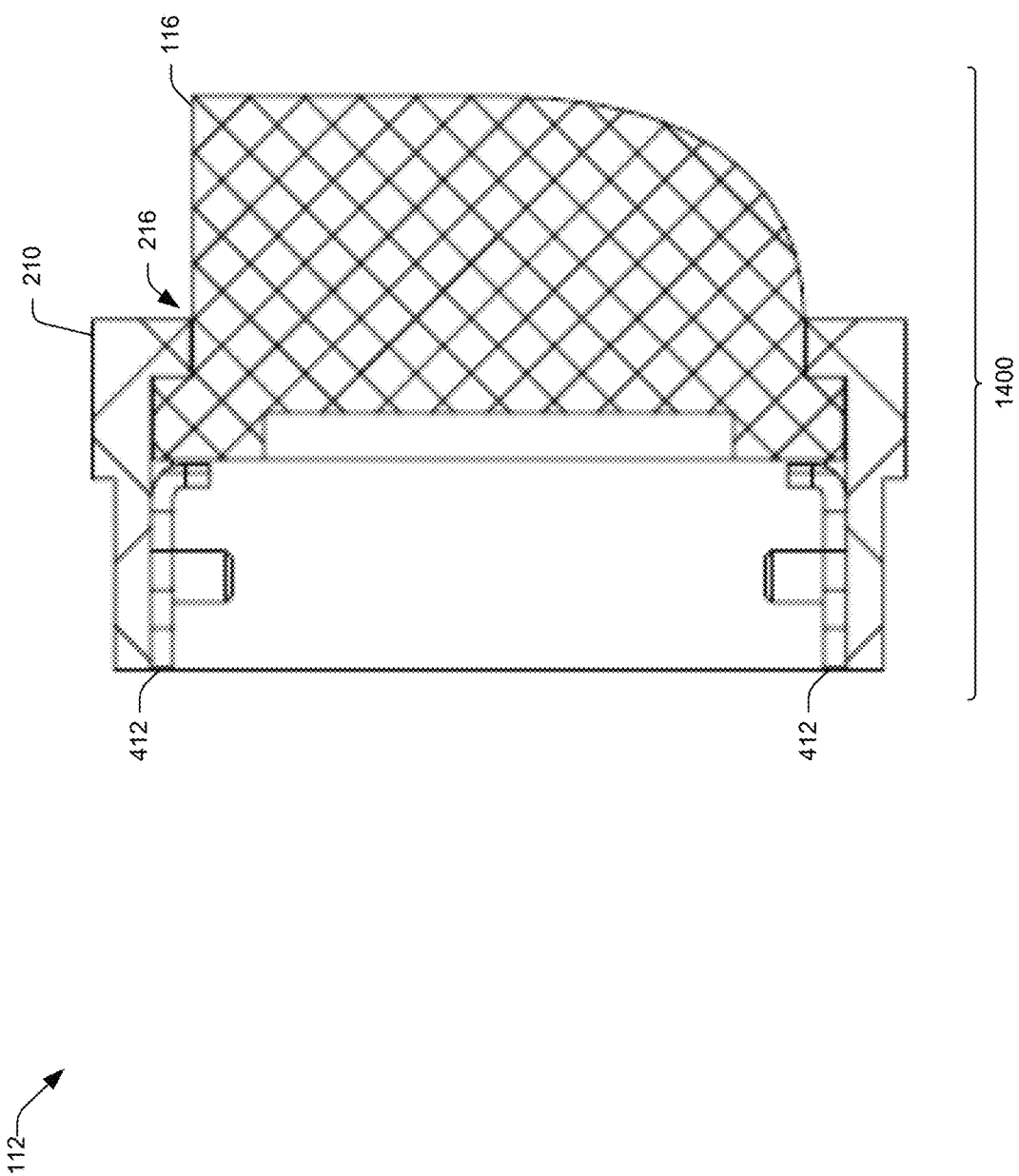
FIG. 14 illustrates a section view of the modular face plate assembly taken along line C-C, in FIG. 13, through an overcurrent protection device holder according to an embodiment in this disclosure.

FIG. 14 illustrates a section view 1400 of the modular face plate assembly 112 taken along line C-C through one of the overcurrent protection device holders of the plurality of overcurrent protection device holders 116. The section view 1400 illustrates the plurality of overcurrent protection device holders 116 may be removably attachable in the opening 216 of the modular frame 210. The one or more brackets 412 are shown attaching the plurality of overcurrent protection device holders 116 to the modular frame 210.

Figure 15:
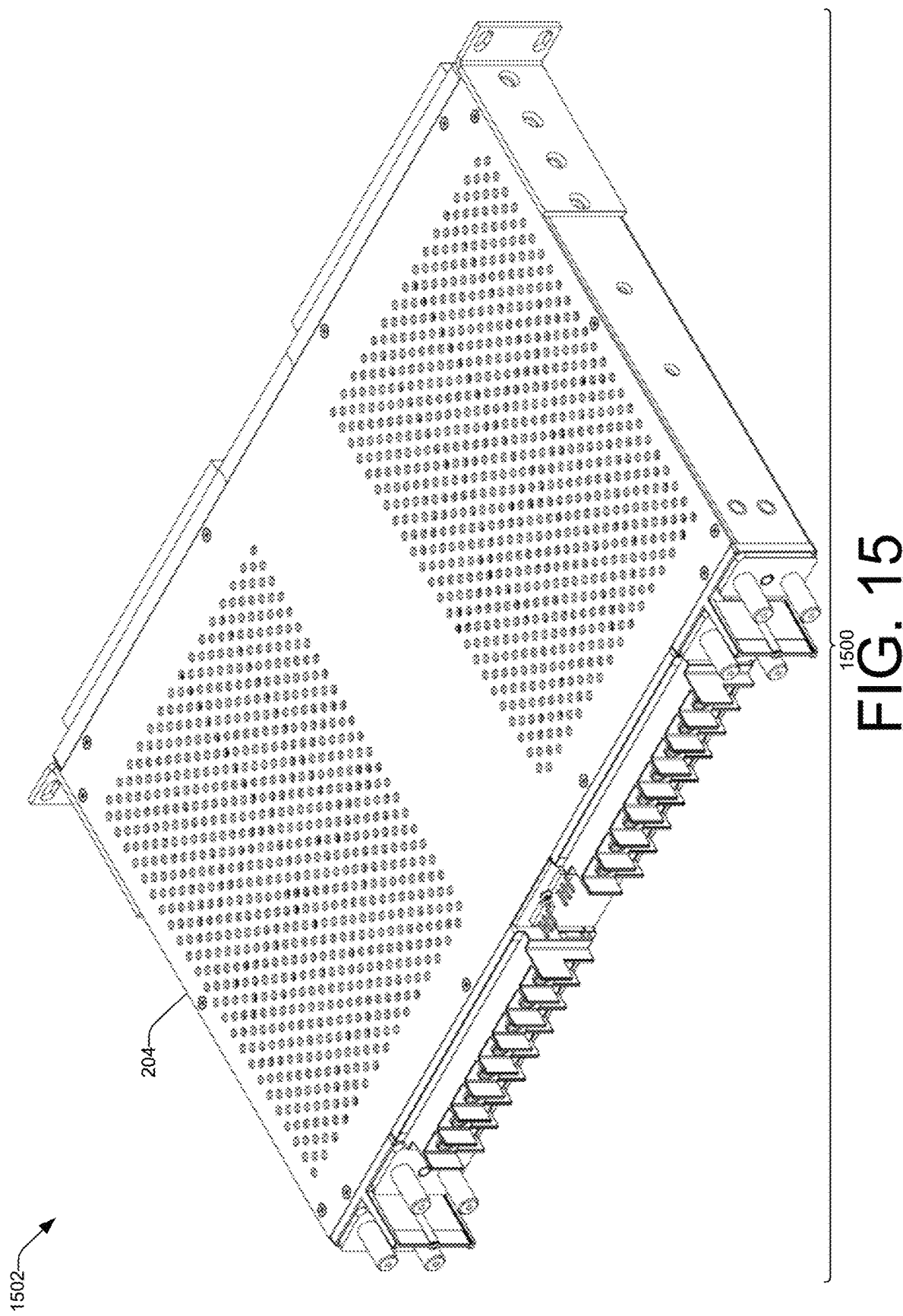
FIG. 15 illustrates a perspective view of an example power distribution panel that may be implemented in the rack of FIG. 1 according to an embodiment in this disclosure.

FIG. 15 illustrates a perspective view 1500 of an example power distribution panel 1502 that may be implemented in the rack 104 of FIG. 1. Inasmuch as FIG. 15 depicts the power distribution panel 1502 implementable in the rack 104 of FIG. 1, while referring to the same elements and features of the power distribution panels 106 and 202, the following discussion of specific features may refer to any one of FIGS. 1 through 10 and/or the accompanying descriptions, except where explicitly indicated. In particular, FIG. 15 illustrates an embodiment of the power distribution panel 1502, including the chassis 204. Though the power distribution panel 1502 includes structural differences from the power distribution panels 106 and 202, the characteristics, performance, function, etc. of the power distribution panel 1502 may be similar to those discussed above with respect to the power distribution panels 106 or 202.

Figure 16:
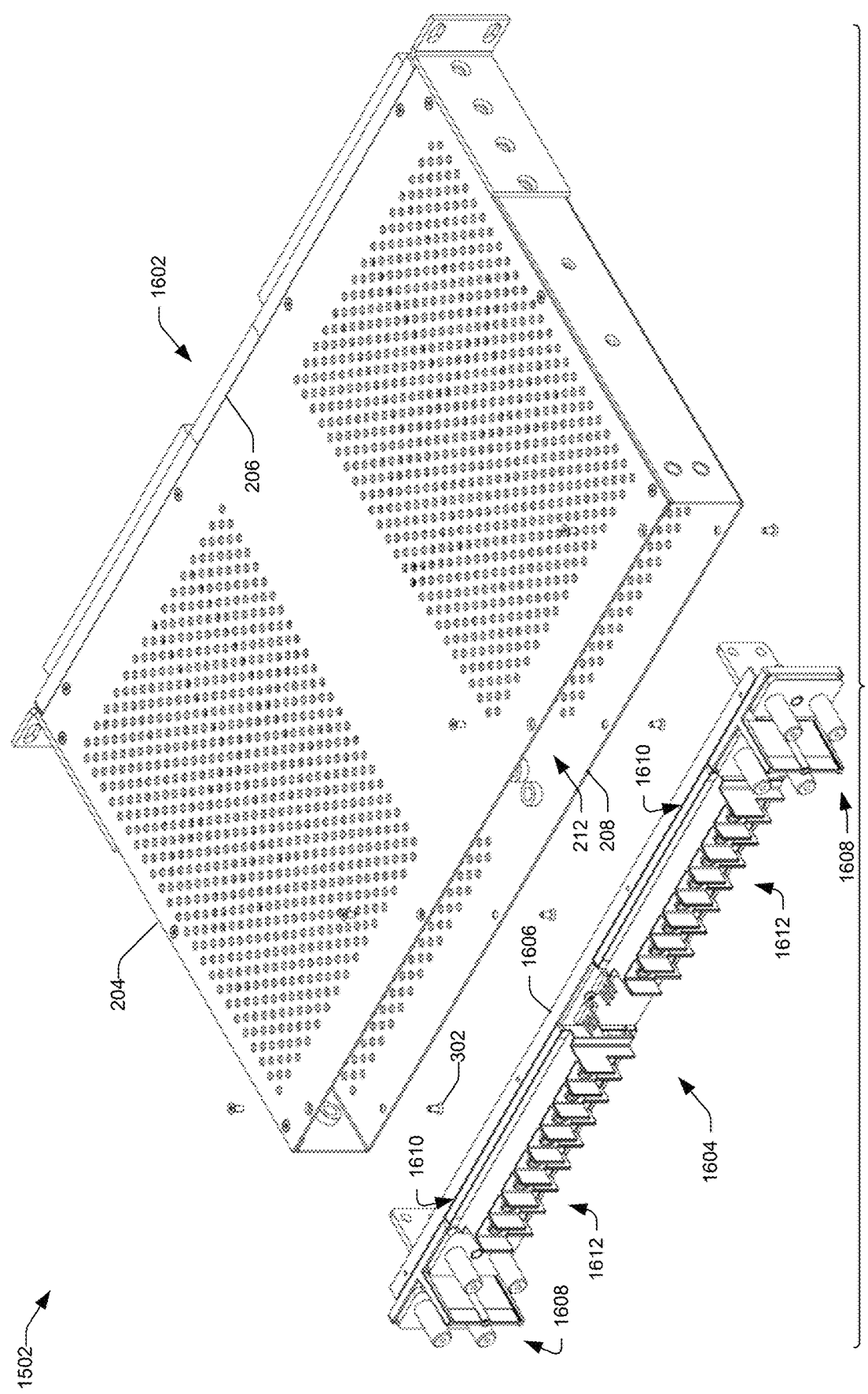
FIG. 16 illustrates a perspective view of a modular face plate assembly removably attached in a front side of a chassis of the power distribution panel illustrated in FIG. 15 and a modular frame assembly removably detached from an aperture of a back side of the chassis of the power distribution panel illustrated in FIG. 15 according to an embodiment in this disclosure.

FIG. 16 illustrates a perspective view 1600 of a modular face plate assembly 1602 removably attached in the front side 206 of the chassis 204 of the power distribution panel 1502 and a modular frame assembly 1604 removably detached from the aperture 212 of the back side 208 of the chassis 204 of the power distribution panel 1502. Though the modular frame assembly 1604 includes structural differences from the modular frame assembly 114, the characteristics, performance, function, etc. of the modular frame assembly 1604 may be similar to those discussed above. For example, the characteristics, performance, function, etc. of the modular frame assembly 1604 may be the same as the characteristics, performance, function, etc. of the modular frame assembly 114 discussed above.

The modular frame assembly 1604 may include a modular frame 1606 removably attachable in the aperture 212 of the back side 208 of the chassis. One or more first modules 1608 may be removably attachable to the modular frame 1606. One or more second modules 1612, different from the one or more first modules 1608, may be removably attachable in the openings 1610 of the modular frame 1606. Though the first and second modules 1608 and 1612 include structural differences from the first and second modules 214 and 218, the characteristics, performance, function, etc. of the first and second modules 1608 and 1612 may be similar to those discussed above. For example, the characteristics, performance, function, etc. of the first and second modules 1608 and 1612 may be the same as the characteristics, performance, function, etc. of the first and second modules 214 and 218 discussed above.

Figure 17:
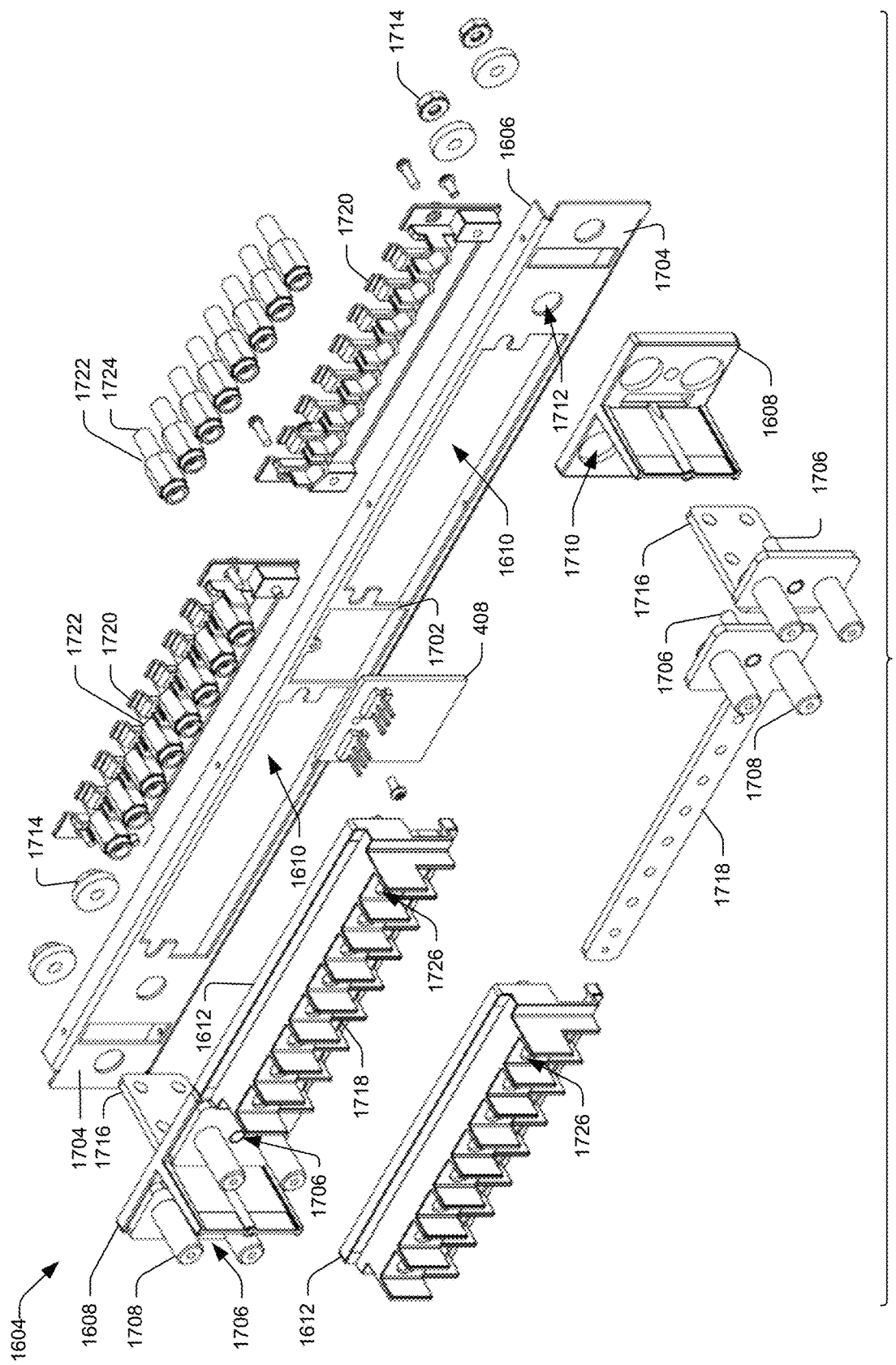
FIG. 17 illustrates an exploded assembly view of a modular frame assembly according to an embodiment in this disclosure.

FIG. 17 illustrates an exploded assembly view 1700 of the modular frame assembly 1604. The modular frame 1606 may include a single member having the openings 1610 therethrough. In an embodiment, the modular frame 1606 may include a portion 1702 to provide for retaining the PCB 408. The one or more first modules 1608 may include one or more fasteners 1706. The one or more fasteners 1706 may be bolts or self-clinching fasteners, studs, etc. that may removably attach the one or more first modules 1608 to portions 1704 of the modular frame 1606. For example, one or more bolts and/or one or more self-clinching fasteners may be used to removably clamp the one or more first modules 1608 to the portions 1704 of the modular frame 1606. The one or more first modules may include one or more fasteners 1708 used to connect the one or more first modules 1608 to the one or more power input cables 124 and/or the one or more power return cables 126. For example, the one or more fasteners 1708 may be one or more bolts and/or one or more self-clinching fasteners that may be used to connect the one or more first modules 1608 to the one or more power input cables 124 and/or the one or more power return cables 126 rather than using one or more threaded headless fasteners (e.g., one or more studs).

The one or more first modules 1608 may include one or more pockets 1710. The one or more pockets 1710 may receive heads of the one or more fasteners 1708. The modular frame 1606 may include one or more openings 1712. The one or more openings 1712 may receive at least a portion of the one or more fasteners 1706. One or more nuts 1714 may thread on the one or more fasteners 1706 and clamp the one or more first modules 1608 to the portions 1704 of the modular frame 1606.

The modular frame assembly 1604 may include a battery busbar 1716 and a return busbar 1718. Though the battery busbar 1716 and a return busbar 1718 include structural differences from the battery busbar 418 and the return busbar 420, the characteristics, performance, function, etc. of the battery busbar 1716 and the return busbar 1718 may be similar to those discussed above. For example, the characteristics, performance, function, etc. of the battery busbar 1716 and the return busbar 1718 may be the same as the characteristics, performance, function, etc. of the battery busbar 418 and the return busbar 420 discussed above.

One or more brackets 1720 may provide for retaining ends 1722 of internal power lines 1724 in respective openings 1726 of the one or more second modules 1612. Though the one or more brackets 1720 include structural differences from the one or more brackets 414, the characteristics, performance, function, etc. of the one or more brackets 1720 may be similar to those discussed above. For example, the characteristics, performance, function, etc. of the one or more brackets 1720 may be the same as the characteristics, performance, function, etc. of the one or more brackets 414 discussed above.

Figure 18:
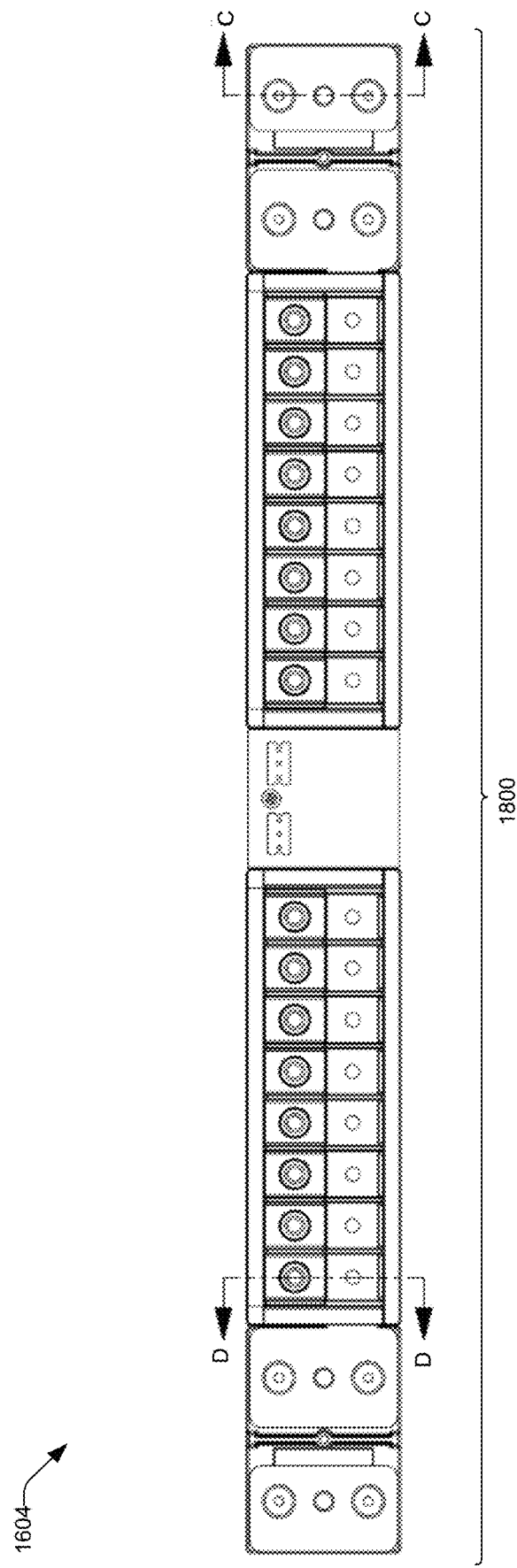
FIG. 18 illustrates a front view of the modular frame assembly according to an embodiment in this disclosure.

FIG. 18 illustrates a front view 1800 of the modular frame assembly 1604 depicting cross-section lines C-C and D-D.

Figure 19:
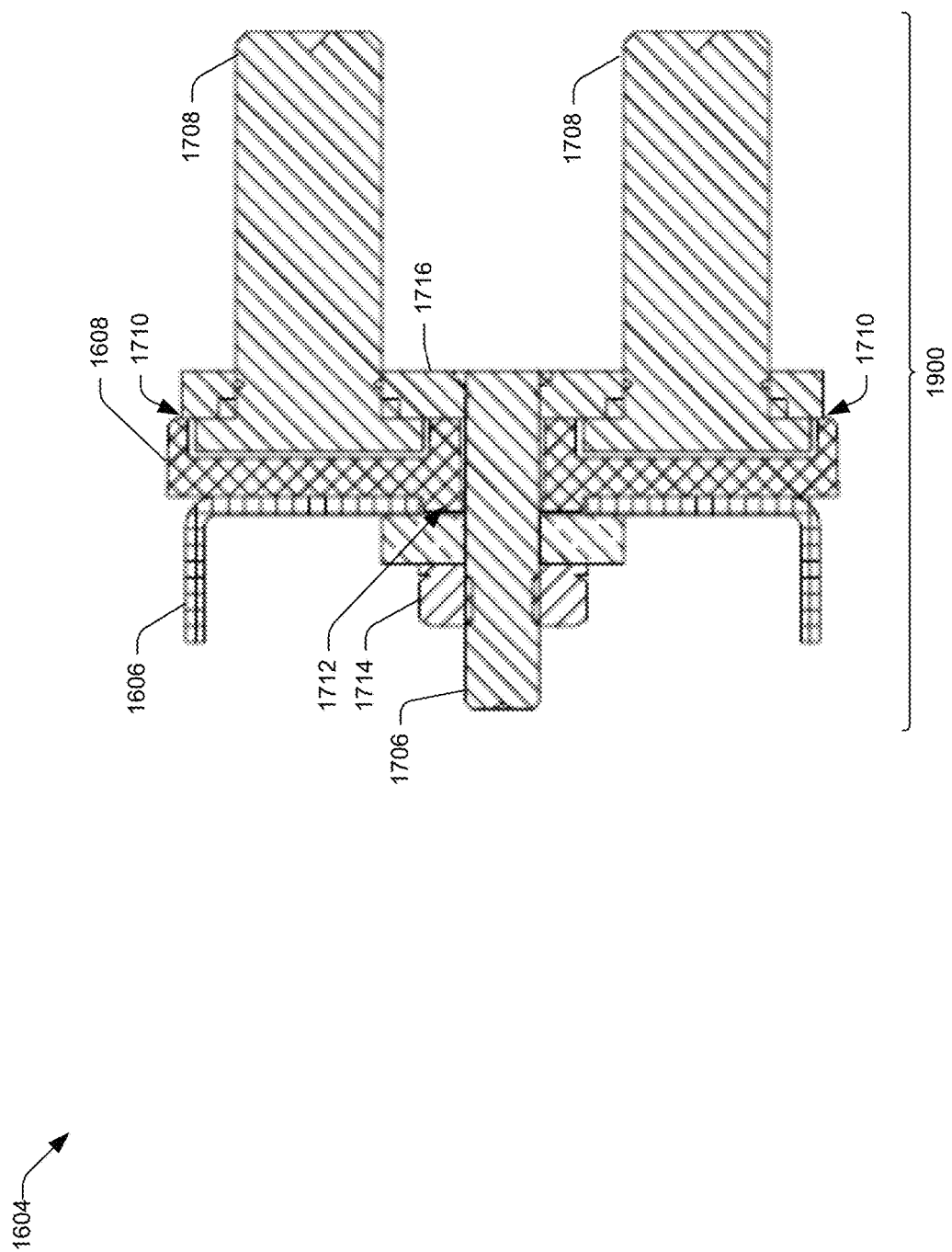
FIG. 19 illustrates a section view of the modular frame assembly taken along line C-C, through a first module according to an embodiment in this disclosure.

FIG. 19 illustrates a section view 1900 of the modular frame assembly 1604 taken along line C-C through one of the one or more first modules 1608. The section view 1900 illustrates the one or more first modules 1608 may be removably attachable to the modular frame 1606. The one or more fasteners 1706 is shown removably attaching the one or more first modules 1608 to modular frame 1606. The heads of the one or more fasteners 1708 are shown received by the one or more pockets 1710 and the one or more fasteners 1708 are shown passing through the opening 1712 to connect the one or more first modules 1608 to the one or more power input cables 124 and/or the one or more power return cables 126.

Figure 20:
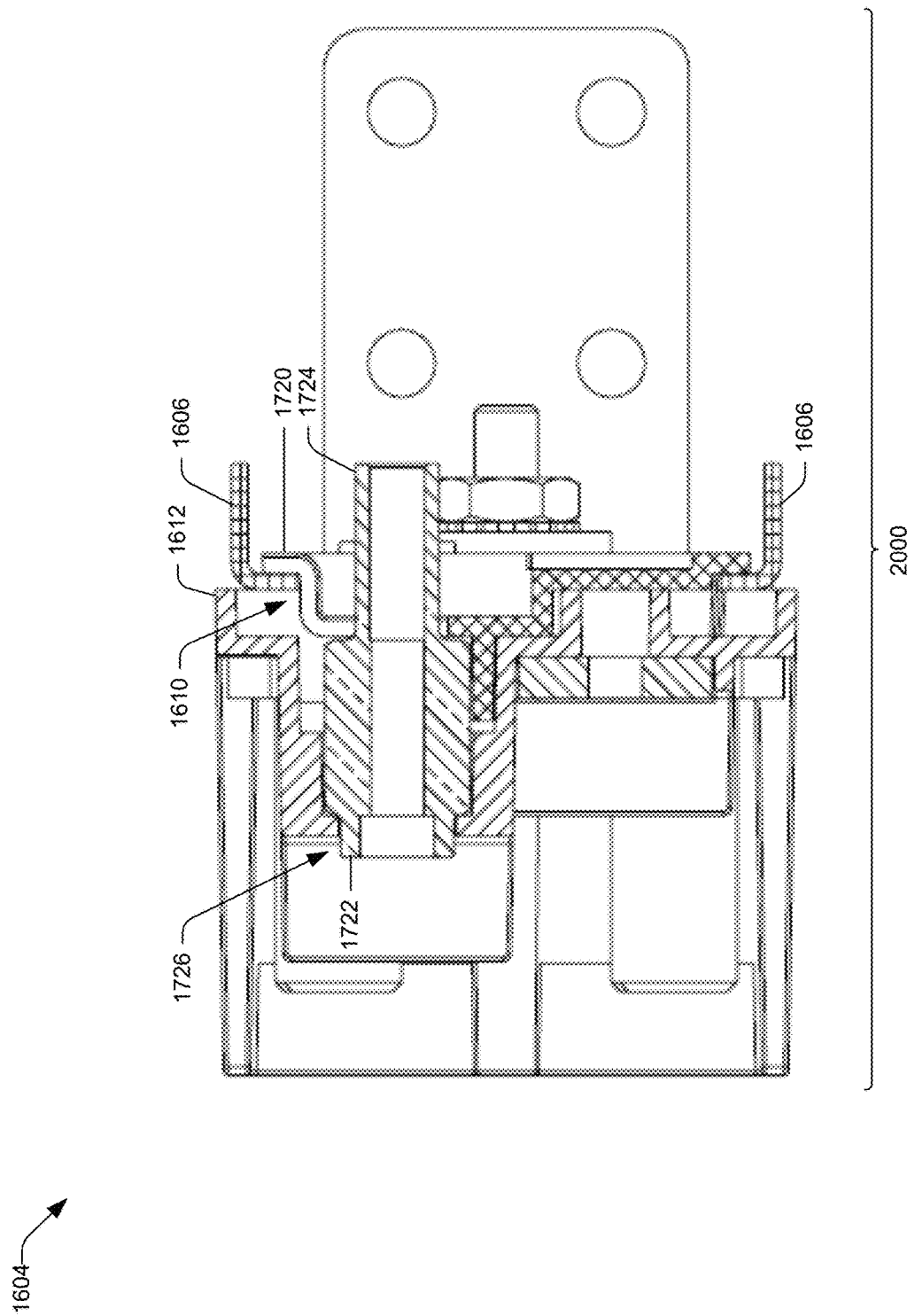
FIG. 20 illustrates a section view of the modular frame assembly taken along line D-D, through a second module according to an embodiment in this disclosure.

FIG. 20 illustrates a section view 2000 of the modular frame assembly 1604 taken along line D-D through one of the one or more second modules 1612. The section view 2000 illustrates the one or more second modules 1612 may be removably attachable in the openings 1610 of the modular frame 1606. The one or more brackets 1720 is shown retaining the end 1722 of the internal power line 1724 in a respective opening 1726 of the one or more second modules 1612.

Figure 21:
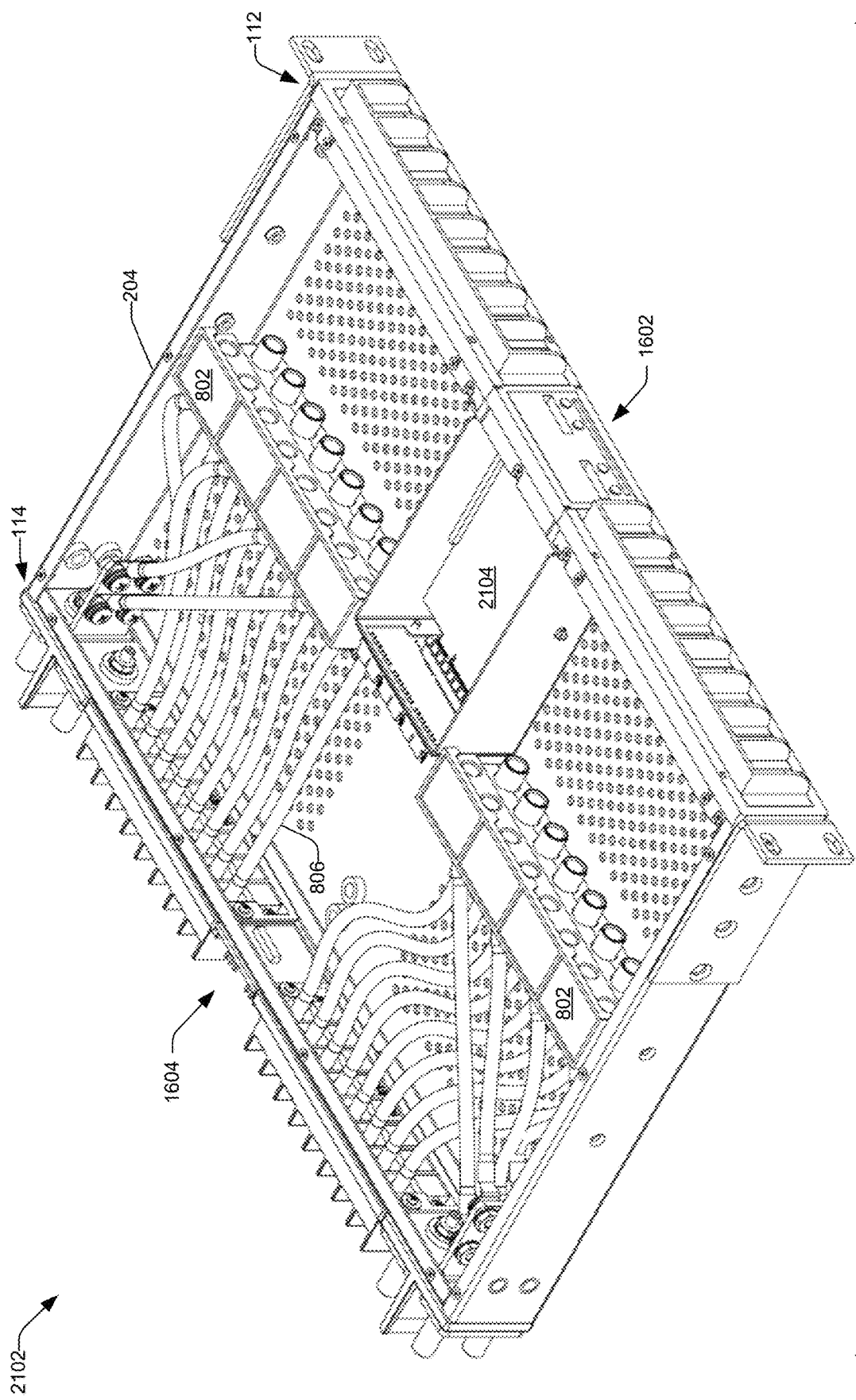
FIG. 21 illustrates a front perspective view of an example power distribution panel according to an embodiment in this disclosure.

FIG. 21 illustrates a front perspective view 2100 of an example power distribution panel 2102 without a lid. The example power distribution panel 2102 may be the same as the power distribution panel 1502 illustrated in FIG. 15. FIG. 21 illustrates the modular face plate assembly 1602, the modular frame assembly 1604, the one or more overcurrent protection device busbars 802, and the internal power lines 806 arranged in the chassis 204 of the power distribution panel 2102. A firebox 2104 may be arranged inside of the chassis 204 proximate to the front side 112 of the chassis 204 and a middle of the chassis 204. The firebox 2104 may provide for protecting overcurrent protection devices (not shown) housed in the chassis 204 from catching fire. The firebox 2104 may meet UL 60950-1 requirements.

Figure 22:
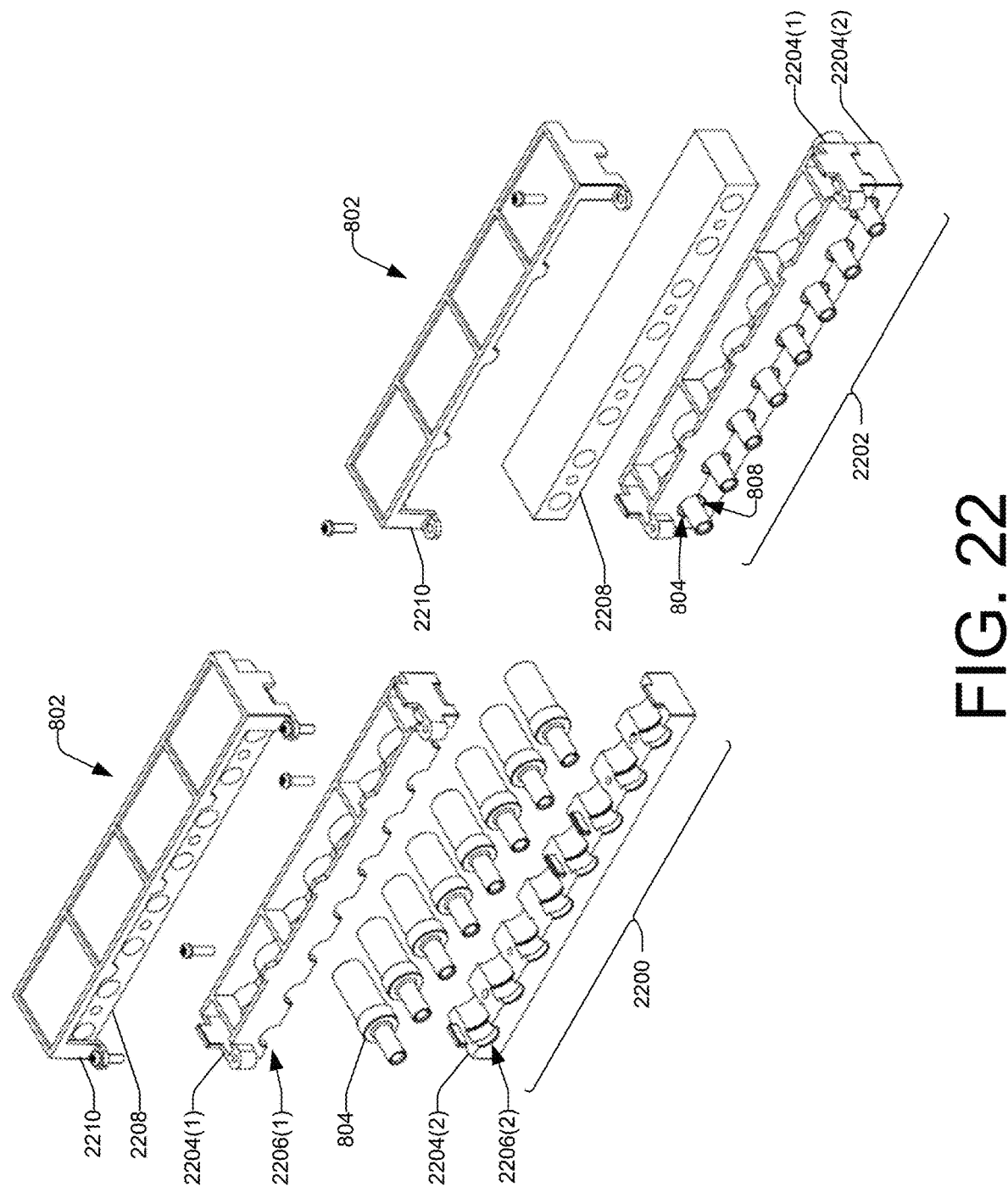
FIG. 22 illustrates exploded assembly views of overcurrent protection device busbars according to an embodiment in this disclosure.

FIG. 22 illustrates exploded assembly views 2200 and 2202 of the one or more overcurrent protection device busbars 802. The one or more overcurrent protection device busbars 802 may include a first member 2204(1) and a second member 2204(2). The first member 2204(1) may be attachable to the second member 2204(2) to removably receive the ends 804 of internal power lines 806. For example, the first and second members 2204(1) and 2204(2) may include first and second portions 2206(1) and 2206(2) (e.g., a first half and a second half) that form the plurality of openings 808, and when the first member 2204(1) is attach to the second member 2204(2), the ends 804 of the internal power lines 806 may be removably received by the plurality of openings 808. The first and second members 2204(1) and 2204(2) may be a clamshell type assembly that clamp together to removeably receive the ends 804 of internal power lines 806. For example, the first and second members 2204(1) and 2204(2) may compress the first and second portions 2206(1) and 2206(2) together to form the plurality of openings 808 to removeably receive the ends 804 of the internal power lines 806. While FIG. 22 illustrates fasteners (e.g., screws, bolts, etc.) may attach the first and second members 2204(1) and 2204(2) together, the first and second members 2204(1) and 2204(2) may be attached together via an interference fit, a press fit, a friction fit, a snap fit, etc.

The one or more overcurrent protection device busbars 802 may include a busbar 2208. The busbar 2208 may attach to one or more of the internal power lines 806 that are attached to a battery busbar (e.g., battery busbar 418 or battery busbar 1716). The one or more overcurrent protection device busbars 802 may include a fastening member 2210. The fastening member 2210 may fasten the busbar 2208 to a portion (e.g., a top portion) of the first member 2204(1).

CONCLUSION

Although the invention has been described in language specific to structural features and/or methodological acts, it is to be understood that the invention is not necessarily limited to the specific features or acts described. Rather, the specific features and acts are disclosed as illustrative forms of implementing the invention. For example, while embodiments are described having certain shapes, sizes, and configurations, these shapes, sizes, and configurations are merely illustrative.

What is claimed is:

1. A power distribution panel for distributing power to a plurality of components from a primary power distribution system, the power distribution panel comprising:
   a modular frame removably attached in an aperture in a side of a chassis, the modular frame including:
      an opening therethrough, the opening of the modular frame disposed in the aperture in the side of the chassis;
      an inner surface of a member of the modular frame surrounding the opening;
      a first module removably attached to the inner surface of the member surrounding the opening; and
      a second module, different from the first module, removably attached to the inner surface of the member surrounding the opening.

2. The power distribution panel of claim 1, wherein:
   the first module is a low current input module via which the power distribution panel is configured to receive upwards of 125 amperes from power input cables and power return cables attached to the primary power distribution system;
   the first module is a medium current input module via which the power distribution panel is configured to receive upwards of 300 amperes from the power input cables and the power return cables attached to the primary power distribution system; or
   the first module is a high current input module via which the power distribution panel is configured to receive upwards of 600 amperes from the power input cables and the power return cables attached to the primary power distribution system.

3. The power distribution panel of claim 1, wherein:
the second module is a low current output module via which the power distribution panel is configured to output upwards of 30 amperes to power output lines and power return lines attached to the plurality of components;
the second module is a medium current output module via which the power distribution panel is configured to output upwards of 100 amperes to the power output lines and the power return lines attached to the plurality of components;
the second module is a low and medium current output module via which the power distribution panel is configured to output upwards of 30 amperes and 100 amperes to the power output lines and the power return lines attached to the plurality of components; or
the second module is a high current output module via which the power distribution panel is configured to output upwards of 250 amperes to the power output lines and the power return lines attached to the plurality of components.

4. The power distribution panel of claim 1, wherein:
the first module includes a battery busbar configured to be attached to one or more power input cables, and
at least a portion of the battery busbar is disposed inside of the chassis and is attached to one or more internal power lines arranged inside of the chassis and to one or more overcurrent protection device busbars arranged inside of the chassis.

5. The power distribution panel of claim 1, wherein:
the first module includes a return busbar configured to attach to one or more power return cables, and
at least a portion of the return busbar is disposed with the second module and is configured to attach to one or more power return lines.

6. The power distribution panel of claim 1, wherein the second module includes a plurality of openings.

7. The power distribution panel of claim 1, wherein:
the modular frame is a single member,
the opening of the modular frame comprises a first opening,
the inner surface of the member surrounding the opening comprises a first inner surface of the member surrounding the first opening,
the modular frame includes a second opening therethrough and a second inner surface of the member surrounding the second opening,
the first module and the second module removably attached to the first inner surface of the member surrounding the first opening, and
wherein the power distribution panel further comprising:
a third module removably attached to the second inner surface of the member surrounding the second opening; and
a fourth module, different from the third module, removably attached to the second inner surface of the member surrounding the second opening.

8. A power distribution panel for distributing power to a plurality of components, the power distribution panel comprising:
a modular frame removably attached in an aperture located in a side of a chassis, the modular frame including an opening therethrough and an inner surface of a member of the modular frame surrounding the opening;
an input module removably attached to the inner surface of the member of the modular frame surrounding the opening, the input module to attach the power distribution panel to one or more power input cables and to one or more power return cables, the one or more power input cables and the one or more power return cables attached to a primary power distribution system; and
an output module, different from the input module, removably attached to the inner surface of the member of the modular frame surrounding the opening, the output module to attach the power distribution panel to power output lines and to power return lines, the power output lines and the power return lines attached to the plurality of components.

9. The power distribution panel of claim 8, wherein:
the input module includes a battery busbar configured to be attached to the one or more power input cables, and
at least a portion of the battery busbar is disposed inside of the chassis and is attached to one or more internal power lines arranged inside of the chassis and attached to one or more overcurrent protection device busbars arranged in the chassis.

10. The power distribution panel of claim 8, wherein:
the input module includes a return busbar configured to attach to the one or more power return cables, and
at least a portion of the return busbar is disposed with the output module and is configured to attach to the one or more power return lines.

11. The power distribution panel of claim 8, wherein:
the input module is a low current input module via which the power distribution panel is configured to receive upwards of 125 amperes from the power input cables and the power return cables attached to the primary power distribution system;
the input module is a medium current input module via which the power distribution panel is configured to receive upwards of 300 amperes from the power input cables and the power return cables attached to the primary power distribution system; or
the input module is a high current input module via which the power distribution panel is configured to receive upwards of 600 amperes from the power input cables and the power return cables attached to the primary power distribution system.

12. The power distribution panel of claim 8, wherein:
the output module is a low current output module via which the power distribution panel is configured to output upwards of 30 amperes to the power output lines and the power return lines attached to the components;
the output module is a medium current output module via which the power distribution panel is configured to output upwards of 100 amperes to the power output lines and the power return lines attached to the components;
the output module is a low and medium current output module via which the power distribution panel is configured to output upwards of 30 amperes and 100 amperes to the power output lines and the power return lines attached to the components; or
the output module is a high current output module via which the power distribution panel is configured to output upwards of 250 amperes to the power output lines and the power return lines attached to the components.

13. The power distribution panel of claim 8, wherein the output module includes a plurality of openings.

14. The power distribution panel of claim 8, further comprising one or more overcurrent protection device busbars disposed inside of the chassis, the one or more overcurrent protection device busbars include a plurality of openings.

15. The power distribution panel of claim 8, wherein:
the modular frame is a single member,
the opening of the modular frame comprises a first opening therethrough,
the inner surface of the member surrounding the opening comprises a first inner surface of the member surrounding the first opening,
the modular frame includes a second opening therethrough and a second inner surface of the member surrounding the second opening,
the input module comprises a first input module removably attached to the first inner surface of the member surrounding the first opening, and
the output module comprises a first output module, different from the first input module, removably attached to the first inner surface of the member surrounding the first opening, and
the power distribution panel further comprising:
a second input module removably attached to the second inner surface of the member surrounding the second opening; and
a second output module, different from the second input module, removably attached to the second inner surface of the member surrounding the second opening.

16. A power distribution panel for distributing power to a plurality of components, the power distribution panel comprising:
a modular frame that is a single member and removably attached in an aperture located in a side of a chassis, the modular frame including an opening therethrough and an inner surface of the single member surrounding the opening;
an input module removably attached to the inner surface of the single member surrounding the opening, the input module to attach the power distribution panel to one or more power input cables and to one or more power return cables, the one or more power input cables and the one or more power return cables attached to a primary power distribution system; and
an output module, different from the input module, removably attached to the inner surface of the single member surrounding the opening, the output module to attach the power distribution panel to power output lines and to power return lines, the power output lines and the power return lines attached to the plurality of components.

17. The power distribution panel of claim 16, wherein:
the input module is a low current input module via which the power distribution panel is configured to receive upwards of 125 amperes from the power input cables and the power return cables attached to the primary power distribution system;
the input module is a medium current input module via which the power distribution panel is configured to receive upwards of 300 amperes from the power input cables and the power return cables attached to the primary power distribution system; or
the input module is a high current input module via which the power distribution panel is configured to receive upwards of 600 amperes from the power input cables and the power return cables attached to the primary power distribution system.

18. The power distribution panel of claim 16, wherein:
the output module is a low current output module via which the power distribution panel is configured to output upwards of 30 amperes to the power output lines and the power return lines attached to the components;
the output module is a medium current output module via which the power distribution panel is configured to output upwards of 100 amperes to the power output lines and the power return lines attached to the components;
the output module is a low and medium current output module via which the power distribution panel is configured to output upwards of 30 amperes and 100 amperes to the power output lines and the power return lines attached to the components; or
the output module is a high current output module via which the power distribution panel is configured to output upwards of 250 amperes to the power output lines and the power return lines attached to the components.

19. The power distribution panel of claim 16, wherein the output module includes a plurality of openings.

20. The power distribution panel of claim 16, wherein:
the opening of the modular frame comprises a first opening therethrough,
the inner surface of the single member surrounding the opening comprises a first inner surface of the single member surrounding the first opening,
the modular frame includes a second opening therethrough and a second inner surface of the single member surrounding the second opening,
the input module comprises a first input module removably attached to the first inner surface of the single member surrounding the first opening, and
the output module comprises a first output module, different from the first input module, removably attached to the first inner surface of the single member surrounding the first opening, and
the power distribution panel further comprising:
a second input module removably attached to the second inner surface of the single member surrounding the second opening; and
a second output module, different from the second input module, removably attached to the second inner surface of the single member surrounding the second opening.

* * * * *